United States Patent
Sakakibara

(10) Patent No.: US 10,707,852 B2
(45) Date of Patent: Jul. 7, 2020

(54) COMPARATOR, AD CONVERTER, SOLID-STATE IMAGING APPARATUS, ELECTRONIC APPARATUS, AND METHOD OF CONTROLLING COMPARATOR

(71) Applicant: SONY SEMICONDUCTOR SOLUTIONS CORPORATION, Kanagawa (JP)

(72) Inventor: Masaki Sakakibara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/325,296

(22) PCT Filed: Aug. 8, 2017

(86) PCT No.: PCT/JP2017/028673
§ 371 (c)(1),
(2) Date: Feb. 13, 2019

(87) PCT Pub. No.: WO2018/037901
PCT Pub. Date: Mar. 1, 2018

(65) Prior Publication Data
US 2019/0207596 A1    Jul. 4, 2019

(30) Foreign Application Priority Data
Aug. 22, 2016 (JP) ................. 2016-161892

(51) Int. Cl.
*H03K 5/24* (2006.01)
*H03M 1/56* (2006.01)
(Continued)

(52) U.S. Cl.
CPC ............. *H03K 5/2481* (2013.01); *H03K 5/08* (2013.01); *H03K 19/0185* (2013.01);
(Continued)

(58) Field of Classification Search
CPC ..... H03K 5/2481; H03K 5/08; H03K 19/0185
See application file for complete search history.

(56) References Cited

U.S. PATENT DOCUMENTS 6,215,331 B1 * 4/2001 Setty ................... G11C 7/065
327/51
6,806,744 B1   10/2004 Bell et al.
(Continued)

FOREIGN PATENT DOCUMENTS

| JP | 2010-109937 | 5/2010 |
|----|-------------|--------|
| JP | 2015-139081 | 7/2015 |
| WO | WO 2016/009832 | 1/2016 |

OTHER PUBLICATIONS

Extended European Search Report for European Patent Application No. 17843386.8, dated Aug. 1, 2019, 7 pages.
(Continued)

*Primary Examiner* — James M Hannett
(74) *Attorney, Agent, or Firm* — Sheridan Ross P.C.

(57) ABSTRACT

The present disclosure relates to a comparator, an AD converter, a solid-state imaging apparatus, an electronic apparatus, and a method of controlling a comparator each of which enables power consumption to be reduced while a decision speed of the comparator is enhanced. A comparator, including: a differential input circuit operating at a first power source voltage, and outputting a signal when a voltage of an input signal is higher than a voltage of a reference signal; a positive feedback circuit operating at a second power source voltage lower than the first power source voltage, and speeding up a transition speed when a comparison result signal representing a result of comparison in voltage between the input signal and the reference signal is inverted; and a voltage converting circuit. The present
(Continued)

disclosure can be applied to an ADC or the like arranged for each pixel of a solid-state imaging apparatus.

14 Claims, 18 Drawing Sheets

(51) Int. Cl.
| | |
|---|---|
| *H04N 5/3745* | (2011.01) |
| *H03K 5/08* | (2006.01) |
| *H03K 19/0185* | (2006.01) |
| *H03M 1/00* | (2006.01) |
| *H04N 5/378* | (2011.01) |
| *H03M 1/34* | (2006.01) |
| *H04N 5/369* | (2011.01) |
| *H03M 1/12* | (2006.01) |
| *H03K 19/20* | (2006.01) |

(52) U.S. Cl.
CPC ............ *H03M 1/002* (2013.01); *H03M 1/34* (2013.01); *H03M 1/56* (2013.01); *H04N 5/3698* (2013.01); *H04N 5/378* (2013.01); *H04N 5/3745* (2013.01); *H04N 5/37455* (2013.01); *H03K 19/20* (2013.01); *H03M 1/123* (2013.01); *H04N 5/379* (2018.08)

(56) References Cited

U.S. PATENT DOCUMENTS

| | | | | |
|---|---|---|---|---|
| 7,208,980 | B2* | 4/2007 | Mulder | G01R 19/16519 327/52 |
| 7,977,979 | B2* | 7/2011 | Cho | H03F 3/45475 327/63 |
| 8,552,797 | B2* | 10/2013 | Lin | H03H 7/0153 327/552 |
| 2011/0068967 | A1* | 3/2011 | Mashiyama | H03M 3/04 341/164 |
| 2011/0169681 | A1* | 7/2011 | Naka | H03K 5/249 341/158 |
| 2011/0215959 | A1 | 9/2011 | Matsuzawa et al. | |
| 2013/0215302 | A1 | 8/2013 | Ueno | |
| 2015/0208008 | A1 | 7/2015 | Gendai | |
| 2017/0272678 | A1* | 9/2017 | Sakakibara | H04N 5/378 |
| 2018/0103216 | A1* | 4/2018 | Sakakibara | H04N 5/378 |

OTHER PUBLICATIONS

International Search Report prepared by the Japan Patent Office dated Oct. 25, 2017, for International Application No. PCT/JP2017/028673.

* cited by examiner

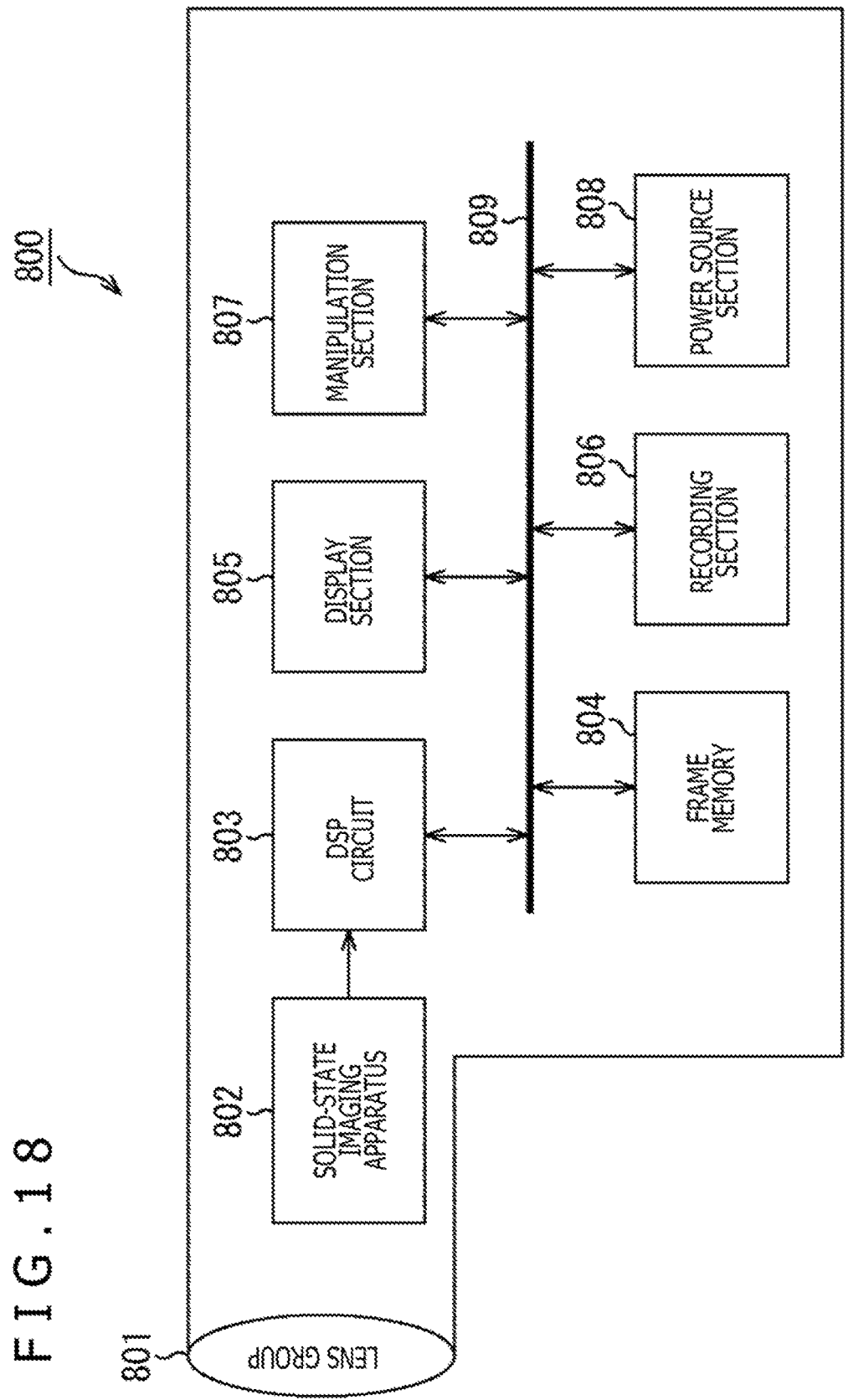

COMPARATOR, AD CONVERTER, SOLID-STATE IMAGING APPARATUS, ELECTRONIC APPARATUS, AND METHOD OF CONTROLLING COMPARATOR

CROSS REFERENCE TO RELATED APPLICATIONS

This application is a national stage application under 35 U.S.C. 371 and claims the benefit of PCT Application No. PCT/JP2017/028673 having an international filing date of 8 Aug. 2017, which designated the United States, which PCT application claimed the benefit of Japanese Patent Application No. 2016-161892 filed 22 Aug. 2016, the entire disclosures of each of which are incorporated herein by reference.

TECHNICAL FIELD

The present disclosure relates to a comparator, an AD converter, a solid-state imaging apparatus, an electronic apparatus, and a method of controlling the comparator, and more particularly to a comparator, an AD converter, a solid-state imaging apparatus, an electronic apparatus, and a method of controlling the comparator each of which enables power consumption to be reduced while a decision speed of the comparator is enhanced.

BACKGROUND ART

In a case where, for example, AD conversion is performed within a limited area such as a pixel by utilizing a signal reading-out system of a solid-state imaging apparatus, the best area efficiency system is an integral type (slope type) AD conversion system which includes a comparator and a digital circuit in a subsequent stage of the comparator.

NPL 1 is proposed as a technology with which AD conversion is tried to be realized within a limited area by using the integral type AD conversion system. For example, the system of NPL 1 adopts a circuit configuration in which a slope signal is inputted to a comparator a plurality of times with a digital circuit in a subsequent stage as one DRAM circuit. For example, in the case of 8-bit AD conversion, the same slope signal is repetitively inputted to the comparator eight times. Then, an operation for storing a code of 0 or 1 at a time point at which an output from the comparator is inverted in a DRAM, and an operation for outputting the code of interest are repetitively performed eight times. At a time point at which comparison is ended with respect to an entire surface, the code of interest is read out to the outside.

CITATION LIST

Non Patent Literature

[NPL 1]
D. Yang, B. Fowler, and A. El Gamal, "A Nyquist rate pixel level ADC for CMOS image sensors," in Proc. IEEE 1998 Custom Integrated Circuits Conf., Santa Clara, Calif., May 1998, pp. 237-240.

SUMMARY

Technical Problem

In a case where an AD converter is arranged in a pixel, unlike a case where there is relatively a degree of freedom in area like column parallel in which an AD converter is arranged every pixel column, or the like, there is a limit to an accommodation area of a circuit. Therefore, it is difficult to manufacture a comparator which sufficiently fulfills a request. For example, a decision speed of the comparison is reduced, or power consumption is increased when performance is tried to be enhanced in some cases.

The present disclosure has been made in the light of such a situation, and enables power consumption to be reduced while a decision speed of a comparator is enhanced.

Solution to Problem

A comparator of one aspect of the present disclosure includes:

a differential input circuit operating at a first power source voltage, and outputting a signal when a voltage of an input signal is higher than a voltage of a reference signal;

a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit; and a voltage converting circuit converting the output signal from the differential input circuit into a signal corresponding to the second power source voltage, in which a source voltage of the differential input circuit is a voltage lower than 0 V.

In the one aspect of the present disclosure, the differential input circuit operates at the first power source voltage, and outputs the signal when the voltage of the input signal is higher than the reference signal. The positive feedback circuit operates at the second power source voltage lower than the first power source voltage, and speeds up the transition speed when the comparison result signal representing the result of the comparison in voltage between the input signal and the reference signal is inverted on the basis of the output signal from the differential input circuit. The voltage converting circuit converts the output signal from the differential input circuit into the signal corresponding to the second power source voltage. In this case, the source voltage of the differential input circuit is the voltage lower than 0 V.

An AD converter of a second aspect of the present disclosure includes a comparator and a data storing section. The comparator includes a differential input circuit operating at a first power source voltage, and outputting a signal when a voltage of an input signal is higher than a voltage of a reference signal, a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and a voltage converting circuit converting the output signal from the differential input circuit into a signal corresponding to the second power source voltage, in which a source voltage of the differential input circuit is a voltage lower than 0 V. The data storing section stores a time code when the comparison result signal is inverted.

In the second aspect of the present disclosure, the differential input circuit operates at the first power source voltage, and outputs the signal when the voltage of the input signal is higher than that of the reference signal. The positive feedback circuit operates at the second power source voltage lower than the first power source voltage, and speeds up the transition speed when the comparison result signal representing the result of the comparison in voltage between the input signal and the reference signal is inverted on the basis of the output signal from the differential input circuit. The voltage converting circuit converts the output signal from the differential input circuit into the signal corresponding to the second power source voltage. In addition, the source voltage of the differential input circuit is the voltage lower than 0 V. The data storing section stores the time code when the comparison result signal is inverted.

A solid-state imaging apparatus of a third aspect of the present disclosure includes an AD converter and a pixel circuit. The AD converter includes a comparator and a data storing section. The comparator includes a differential input circuit operating at a first power source voltage, and outputting a signal when a voltage of an input signal is higher than a voltage of a reference signal, a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and a voltage converting circuit converting the output signal from the differential input circuit into a signal corresponding to the second power source voltage, in which a source voltage of the differential input circuit is a voltage lower than 0 V. The data storing section stores a time code when the comparison result signal is inversed. The pixel circuit outputs an electric charge signal produced by receiving light incident to a pixel and then subjects the light to photoelectric conversion as the input signal to the differential input circuit.

An electronic apparatus of a fourth aspect of the present disclosure includes a solid-state imaging apparatus including an AD converter and a pixel circuit. The AD converter includes a comparator and a data storing section. The comparator includes a differential input circuit operating at a first power source voltage, and outputting a signal when a voltage of an input signal is higher than a voltage of a reference signal, a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and a voltage converting circuit converting the output signal from the differential input circuit into a signal corresponding to the second power source voltage, in which a source voltage of the differential input circuit is a voltage lower than 0 V. The data storing section stores a time code when the comparison result signal is inverted. The pixel circuit outputs an electric charge signal produced by receiving light incident to a pixel and then subjects the light to photoelectric conversion as the input signal to the differential input circuit.

In each of the third and fourth aspects of the present disclosure, the differential input circuit operates at the first power source voltage, and outputs the signal when the voltage of the input signal is higher than the reference signal. The positive feedback circuit operates at the second power source voltage lower than the first power source voltage, and speeds up the transition speed when the comparison result signal representing the result of the comparison in voltage between the input signal and the reference signal is inverted on the basis of the output signal from the differential input circuit. The voltage converting circuit converts the output signal from the differential input circuit into the signal corresponding to the second power source voltage. The source voltage of the differential input circuit is the voltage lower than 0 V. The data storing section stores the time code when the comparison result signal is inverted. The pixel circuit outputs as the input signal to the differential input circuit. In this case, the light made incident to the pixel is received to be subjected to the photoelectric conversion to produce the electric charge signal by the pixel circuit.

A method of controlling a comparator of a fifth aspect of the present disclosure, the comparator including a differential input circuit operating at a first power source voltage, a positive feedback circuit operating at a second power source voltage lower than the first power source voltage, and a voltage converting circuit, a source voltage of the differential input circuit being lower than 0 V, the method includes:

the differential input circuit outputting a signal when a voltage of an input signal is higher than a voltage of a reference signal;

the voltage converting circuit converting an output signal from the differential input circuit into a signal corresponding to the second power source voltage; and the positive feedback circuit speeding up a transition speed when a comparison result signal representing a result of comparison in voltage between the input signal and the reference signal is inverted on the basis of the output signal from the differential input signal obtained by conversion in the voltage converting circuit.

In the fifth aspect of the present disclosure, the comparator includes the differential input circuit operating at the first power source voltage, the positive feedback circuit operating at the second power source voltage lower than the first power source voltage, and the voltage converting circuit, in which the source voltage of the differential input circuit is configured to be lower than 0 V. In the differential input circuit, the signal is outputted when the voltage of the input signal is higher than the voltage of the reference signal. In the voltage converting circuit, the output signal from the differential input circuit is converted into the signal corresponding to the second power source voltage. In the positive feedback circuit, the transition speed when the comparison result signal representing the result of comparison in voltage between the input signal and the reference signal is inverted is speeded up on the basis of the output signal from the differential input signal obtained by conversion in the voltage converting circuit.

The comparator, the AD converter, the solid-state imaging apparatus, the electronic apparatus, and the method of controlling the comparator may be independent apparatuses or may be modules incorporated in other apparatuses.

Advantageous Effects of Invention

According to the first to fifth aspects, the consumed power can be reduced while the decision speed of the comparator is enhanced.

It should be noted that the effect described here is not necessarily limited, and any of effects described in the present disclosure may also be offered.

BRIEF DESCRIPTION OF DRAWINGS

FIG. 18 is a block diagram depicting a configuration example of an imaging apparatus as an electronic apparatus according to the present disclosure.

DESCRIPTION OF EMBODIMENTS

Hereinafter, modes for carrying out the present disclosure (hereinafter referred to as embodiments) will be described. It should be noted that a description will be given in the following order.
1. Schematic Configuration Example of Solid-State Imaging apparatus
2. Detailed Configuration Example of Pixel
3. First Configuration Example of Comparison Circuit
4. Second Configuration Example of Comparison Circuit
5. Third Configuration Example of Comparison Circuit
6. Fourth Configuration Example of Comparison Circuit
7. Fifth Configuration Example of Comparison Circuit
8. Sixth Configuration Example of Comparison Circuit
9. Configuration Example of Pixel Sharing
10. Configuration 1 of Plural Substrates
11. Configuration 2 of Plural Substrates
12. Application Example to Electronic Apparatus <1. Schematic Configuration Example of Solid-State Imaging Apparatus>

Figure 1:
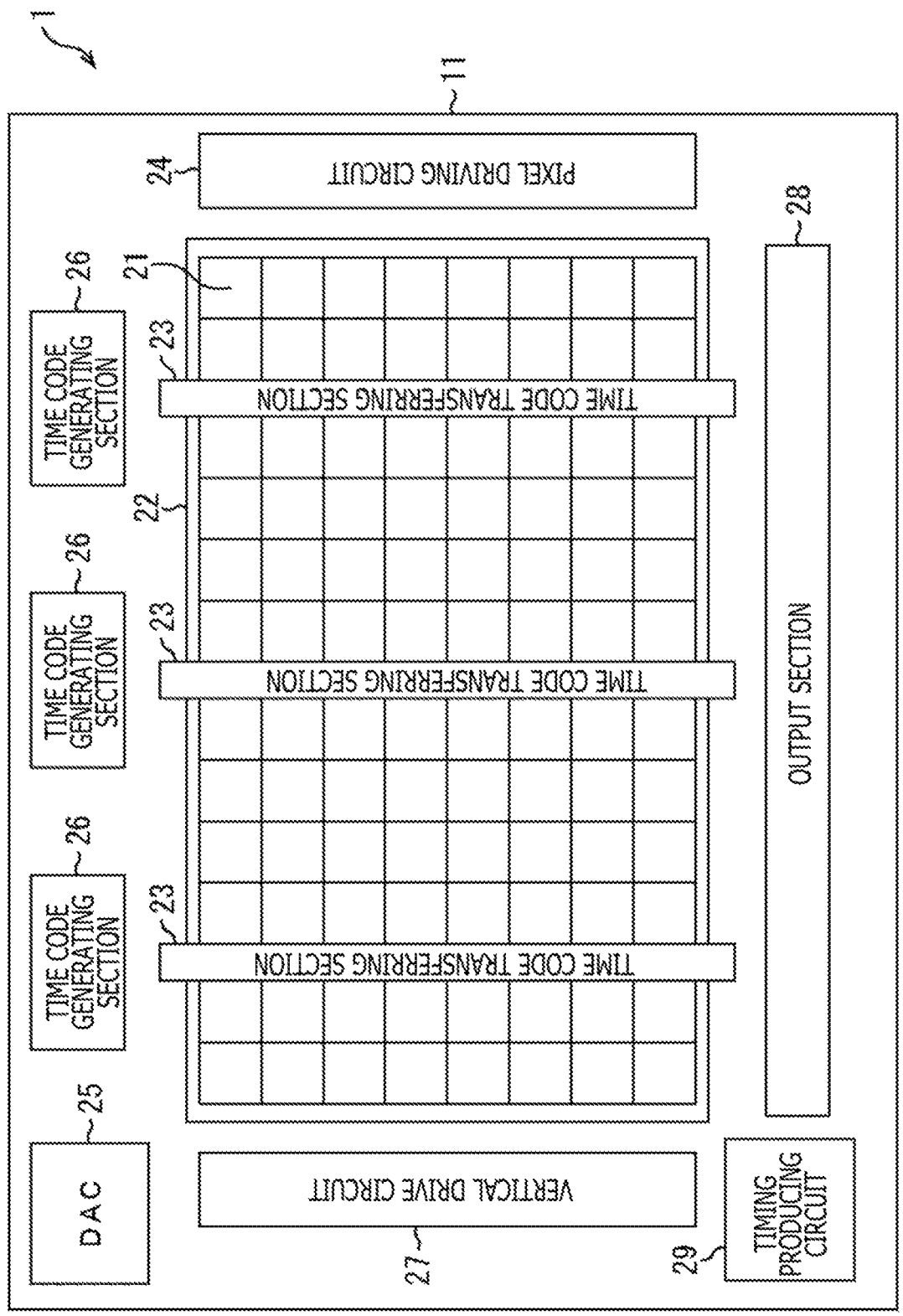
FIG. 1 is a diagram depicting a schematic configuration of a solid-state imaging apparatus according to the present disclosure.

FIG. 1 depicts a schematic configuration of a solid-state imaging apparatus according to the present disclosure.

A solid-state imaging apparatus 1 of FIG. 1 has a pixel array section 22 in which pixels 21 are arranged in a two-dimensional array on a semiconductor substrate 11 using, for example, silicon (Si) as a semiconductor. The pixel array section 22 is also provided with a time code transferring section 23 transferring a time code produced in a time code generating section 26 to each of the pixels 21. Then, a pixel driving circuit 24, a D/A converter (DAC) 25, the time code generating section 26, a vertical drive circuit 27, an output section 28, and a timing producing circuit 29 are formed in the periphery of the pixel array section 22 on the semiconductor substrate 11.

Figure 2:
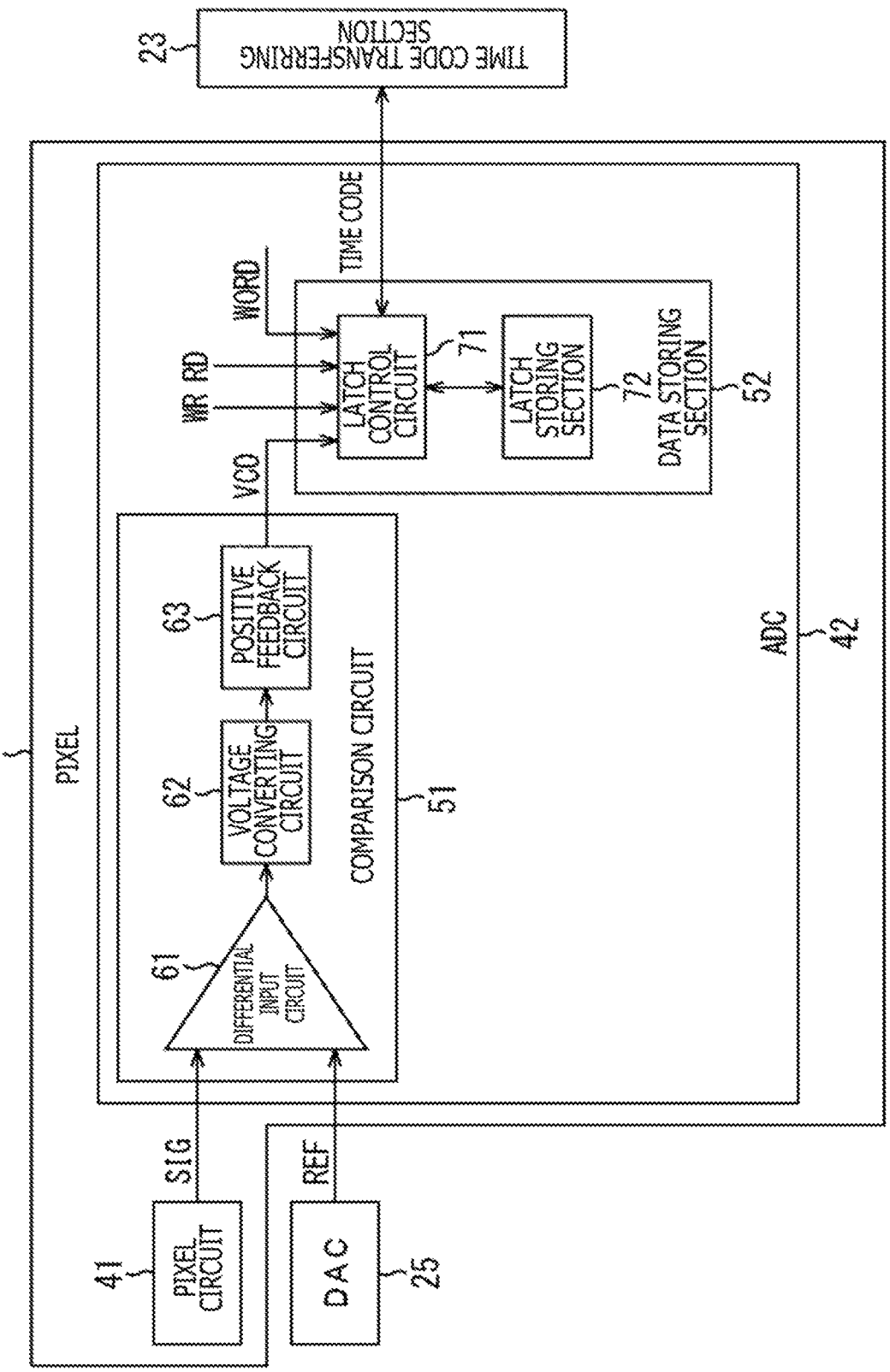
FIG. 2 is a block diagram depicting a detailed configuration example of a pixel.

Each of the pixels 21 which are arranged in the two-dimensional array, as will be described later with reference to FIG. 2, is provided with a pixel circuit 41 and an ADC 42. The pixel 21 produces an electric charge signal responding to a quantity of light received by a light receiving element (for example, a photodiode) within the pixel, and converts the electric charge signal into a digital pixel signal SIG which is in turn outputted.

The pixel driving circuit 24 drives the pixel circuit 41 (FIG. 2) within the pixel 21. The DAC 25 produces a reference signal (reference voltage signal) REF as a slope signal in which a level (voltage) is monotonically reduced in response to a lapse of time, and supplies the reference signal REF to each of the pixels 21. The time code generating section 26 produces a time code which is used when an analog pixel signal SIG is converted (AD conversion) into a digital signal, and supplies the time code to the corresponding time code transforming section 23. A plurality of time code generating sections 26 are provided in the pixel array section 22. The time code transferring sections 23 are provided within the pixel array section 22 by the number corresponding to the number of time code generating sections 26. In other words, the time code generating sections 26, and the time code transferring sections 23 transferring the time codes produced in the time code generating sections 26 exhibit a one-to-one correspondence.

The vertical drive circuit 27 performs control in which the digital pixel signals SIG produced in the pixels 21 are outputted to the output section 28 in a predetermined order on the basis of a timing signal supplied from the timing producing circuit 29. The digital pixel signal SIG outputted from the pixel 21 is outputted from the output section 28 to the outside of the solid-state imaging apparatus 1. The output section 28 executes predetermined digital signal processing such as a black level correction processing correcting a black level or correlated double sampling (CDS) processing according to need, and thereafter, outputs the resulting digital pixel signal to the outside.

The timing producing circuit 29 includes a timing generator producing various kinds of timing signals, and the like, and supplies the various kinds of timing signals produced to the pixel driving circuit 24, the DAC 25, the vertical drive circuit 27, and the like.

The solid-state imaging apparatus 1 is configured in the manner as described above. Note that, although in FIG. 1, as described above, the description has been given in such a way that all the circuits configuring the solid-state imaging apparatus are formed on one sheet of semiconductor substrate 11, as will be described later, a configuration can be adopted such that the circuits configuring the solid-state imaging apparatus 1 are arranged separately from one another on a plurality of sheets of the semiconductor substrates 11.

<2. Detailed Configuration Example of Pixel>

FIG. 2 is a block diagram depicting a detailed configuration of the pixel 21.

The pixel 21 includes a pixel circuit 41 and the AD converter (ADC 42).

The pixel circuit 41 outputs the electric charge signal responding to the quantity of received light as the analog pixel signal SIG to the ADC 42. The ADC 42 converts the analog pixel signal supplied thereto from the pixel circuit 41 into the digital signal.

The ADC 42 includes a comparison circuit 51 and a data storing section 52.

The comparison circuit 51 compares the pixel signal SIG with the reference signal REF supplied thereto from the DAC 25, and outputs an output signal VCO as a comparison result signal indicating a comparison result. When the reference signal REF and the pixel signal SIG become identical (voltage) to each other, the comparison circuit 51 inverts the output signal VCO.

Although the comparison circuit 51 includes a differential input circuit 61, a voltage converting circuit 62, and a positive feedback (PFB) circuit 63, details thereof will be described later with reference to FIG. 3.

The output signal VCO is inputted from the comparison circuit 51 to the data storing section 52. In addition thereto, A WR signal indicating an operation for writing the pixel signal, an RD signal indicating an operation for reading out the pixel signal, and a WORD signal in which a reading timing of the pixel 21 in the operation for reading out the pixel signal is controlled are all supplied from the vertical drive circuit 27 to the data storing section 52. In addition, the time code produced in the time code generating section 26 is also supplied to the data storing section 52 through the time code transferring section 23.

The data storing section 52 includes a latch control circuit 71 controlling the writing operation and the reading operation for the time code based on the WR signal and the RD signal, respectively, and a latch storing section 72 storing the time code.

The latch control circuit 71, in the writing operation for the time code, while the output signal VCO at High (Hi) is inputted from the comparison circuit 51, causes the latch storing section 72 to store the time code which is supplied from the time code transferring section 23 and is updated every unit time. Then, when the reference signal REF and the pixel signal SIG become identical (voltage) to each other, and the output signal VCO supplied from the comparison circuit 51 is inverted to Low (Lo), the writing (update) of the supplied time code is stopped, and the latch storing section 72 is caused to hold the time code most recently stored in the latch storing section 72. The time code stored in the latch storing section 72 represents the time when the pixel signal SIG and the reference signal REF were equal to each other. Thus, the time code represents the data indicating that the pixel signal SIG was the reference voltage at that time, that is, the digitized value of the quantity of light.

After the sweeping of the reference signal REF was ended, and the time code was stored in the latch storing sections 72 of all the pixels 21 within the pixel array section 22, the operation of the pixel 21 is changed from the writing operation to the reading operation.

In the operation for reading out the time code, the latch control circuit 71, when it becomes the reading timing of the pixel 21 itself, outputs the time code (digital pixel signal SIG) stored in the latch storing section 72 to the time code transferring section 23 on the basis of the WORD signal in accordance with which the reading timing is controlled. The time code transferring section 23 successively transfers the time codes supplied thereto in the column direction (in the vertical direction), and supplies the time codes to the output section 28.

Hereinafter, for the purpose of distinguishing the time code of interest from the time code which is written to the latch storing section 72 in the operation for writing the time code, the digitized pixel data which is the inverted time code when the output signal VCO read out from the latch storing section 72 in the operation for reading out the time code is inverted and which indicates that the pixel signal SIG was the reference voltage at that time will be referred to as AD conversion pixel data as well.

<3. First Configuration Example of Comparison Circuit>

Figure 3:
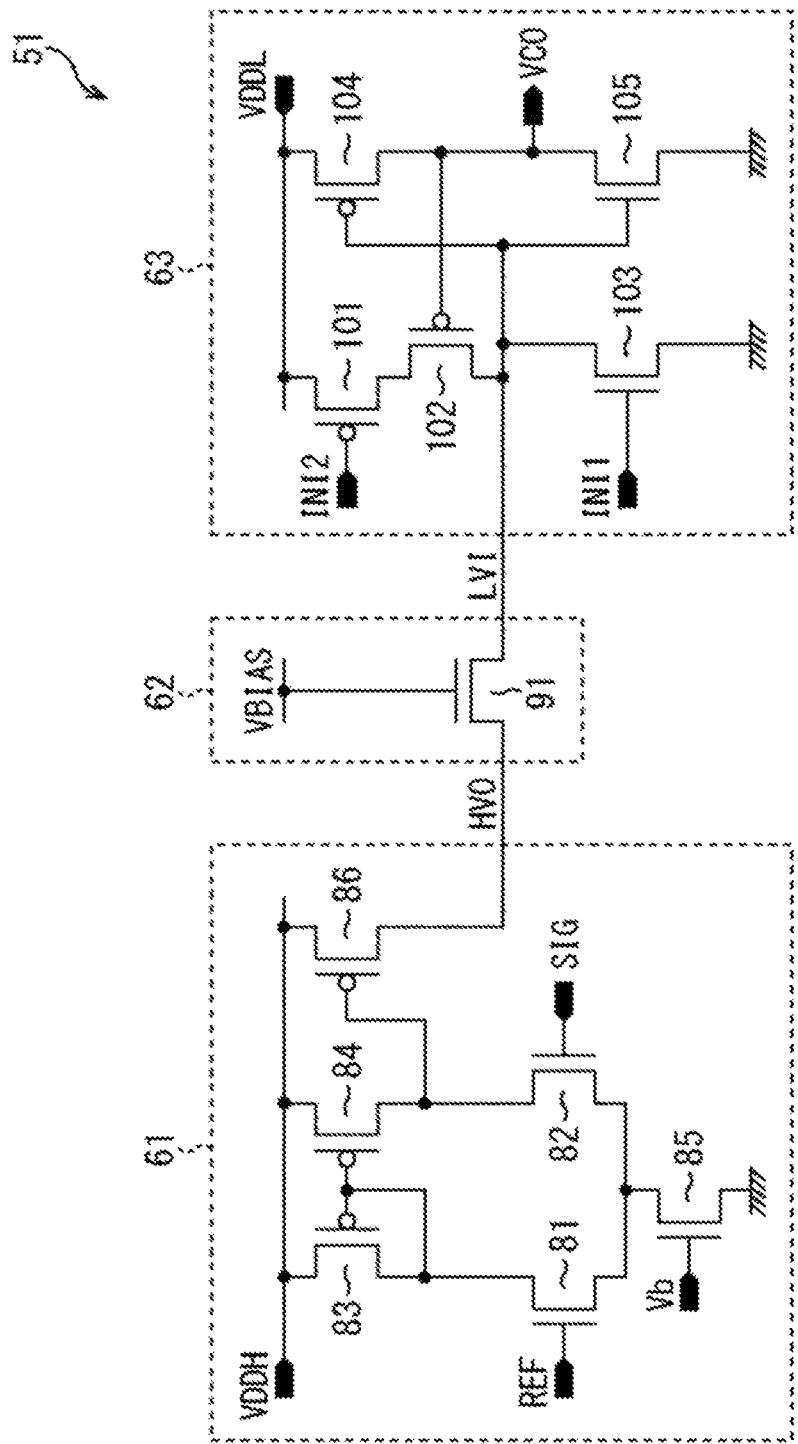
FIG. 3 is a circuit diagram depicting a first configuration of a comparison circuit.

FIG. 3 is a circuit diagram depicting a detailed configuration of the differential input circuit 61, the voltage converting circuit 62, and the positive feedback circuit 63 which configure the comparison circuit 51.

The differential input circuit 61 compares the pixel signal SIG outputted from the pixel circuit 41 within the pixel 21 with the reference signal REF outputted from the DAC 25, and outputs a predetermined signal (current) when the pixel signal SIG is higher than the reference signal REF.

The differential input circuit 61 includes transistors 81 and 82 serving as a differential pair, transistors 83 and 84 configuring a current mirror, a transistor 85 as a constant current source for supplying a current IB responding an input bias current $V_b$, and a transistor 86 for outputting an output signal HVO from the differential input circuit 61.

Each of the transistors 81, 82, and 85 includes a negative channel MOS (NMOS) transistor, and each of the transistors 83, 84, and 86 includes a positive channel MOS (PMOS) transistor.

The reference signal REF outputted from the DAC 25 is inputted to a gate of the transistor 81 of the transistors 81 and 82 serving as the differential pair, and the pixel signal SIG outputted from the pixel circuit 41 within the pixel 21 is inputted to a gate of the transistor 82. Sources of the transistors 81 and 82 are connected to a drain of the transistor 85, and a source of the transistor 85 is connected to the ground (GND).

A drain of the transistor 81 is connected to gates of the transistors 83 and 84 configuring the current mirror circuit, and a drain of the transistor 83, and a drain of the transistor 82 is connected to a drain of the transistor 84 and a gate of the transistor 86. Sources of the transistors 83, 84 and 86 are connected to a first power source voltage VDDH.

The voltage converting circuit 62, for example, includes an NMOS type transistor 91. A drain of the transistor 91 is connected to a drain of the transistor 86 of the differential input circuit 61, a source of the transistor 91 is connected to a predetermined connection point within the positive feedback circuit 63, and a gate of the transistor 86 is connected to a bias voltage VBIAS.

The transistors 81 to 86 configuring the differential input circuit 61 is a circuit which operates at a high voltage up to the first power source voltage VDDH, and the positive feedback circuit 63 is a circuit which operates at a second power source voltage VDDH lower than the first power source voltage VDDH. Here, the first power source voltage VDDH, for example, is set to 2.9 [V], and the second source voltage VDDL, example, is set to 1.1 [V]. The voltage converting circuit 62 converts the output voltage HVO inputted thereto from the differential input circuit 61 into a low voltage signal (conversion signal) LVI at which the positive feedback circuit 63 can operate, and outputs the resulting signal LVI to the positive feedback circuit 63.

It is sufficient if the bias voltage VBIAS is a voltage which is converted into a voltage at which the transistors 101 to 105 of the positive feedback circuit 63 which operates at the low voltage are not broken. For example, the bias voltage VBIAS can be set to the same voltage as the second power source voltage VDDL of the positive feedback circuit 63 (VBIAS=VDDL).

The positive feedback circuit 63 outputs a comparison result signal which is inverted when the pixel signal SIG is higher than the reference signal REF on the basis of the conversion signal LVI with which the output signal HVO from the differential input circuit 61 is converted into a signal corresponding to the second power source voltage VDDL. In addition, the positive feedback circuit 63 speeds up a transition speed when the output signal VCO which is outputted as the comparison result signal is inverted.

The positive feedback circuit 63 includes five transistors 101 to 105. Here, each of the transistors 101, 102 and 104 includes a PMOS transistor, and each of the transistors 103 and 105 includes an NMOS transistor.

A source of the transistor 91 as an output terminal of the voltage converting circuit 62 is connected to drains of the transistors 102 and 103, and gates of the transistors 104 and 105. Sources of the transistors 101 and 104 are connected to the second power source voltage VDDL, a drain of the transistor 101 is connected to a source of the transistor 102, and a gate of the transistor 102 is connected to drains of the transistors 104 and 105 as an output terminal of the positive feedback circuit. Each of sources of the transistors 103 and 105 is connected to GND. An initialization signal INI2 is supplied to a gate of the transistor 101, and an initialization signal INI1 is supplied to a gate of the transistor 103.

The transistors 104 and 105 configure an inverter circuit, and a connection point between drains of the transistors 104 and 105 becomes an output terminal from which the comparison circuit 51 outputs the output signal VCO.

Figure 4:
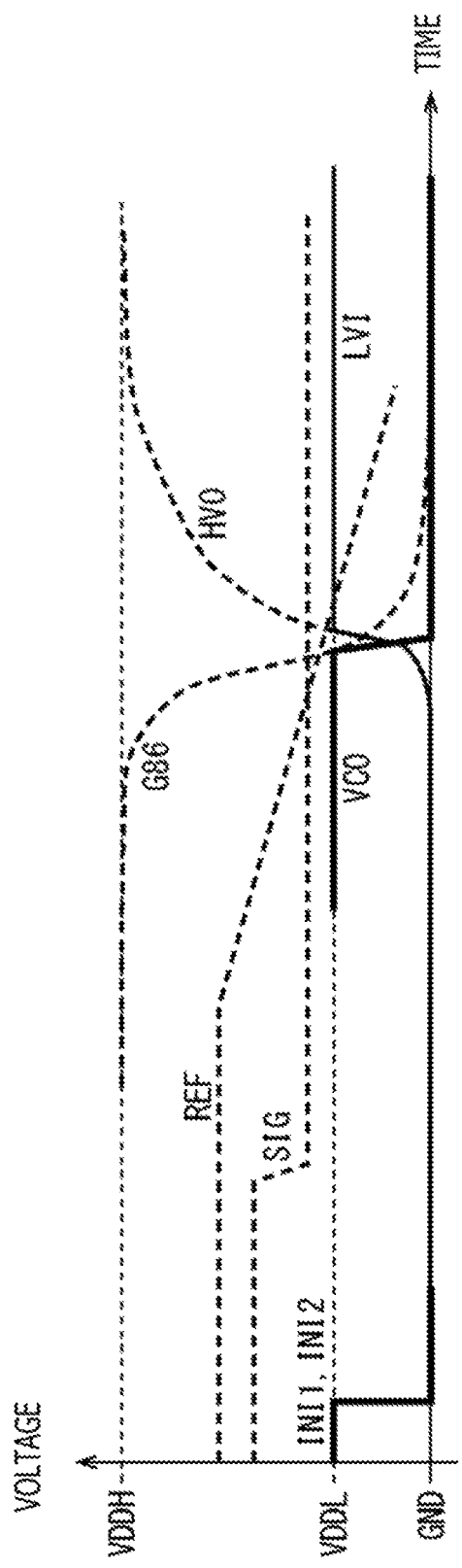
FIG. 4 is a graph expressing transition of signals during an operation of the comparison circuit.

A description will now be given with respect to an operation of the comparison circuit 51 configured in the manner as depicted above. FIG. 4 represents transition of each of the signals during the operation of the comparison circuit 51. It should be noted that, in FIG. 4, "G86" represents a gate potential of the transistor 86.

First, the reference signal REF is set to a voltage higher than that of the pixel signal SIG of each of the pixels 21, and each of the initialization signals INI1 and INI2 is set to Hi, thereby initializing the comparison circuit 51.

More specifically, the reference signal REF is applied to the gate of the transistor 81, and the pixel signal SIG is applied to the gate of the transistor 82. When the voltage of the reference signal REF is higher than the voltage of the pixel signal SIG, almost the current outputted from the transistor 85 becoming a current source is caused to flow into the transistor 83 diode-connected via the transistor 81. A channel resistance of the transistor 84 having the common gate with the transistor 83 becomes sufficiently low, so that the gate of the transistor 86 is held approximately at the first power source voltage VDDH level, thereby cutting off the transistor 86. Therefore, even if the transistor 91 of the voltage converting circuit 62 conducts, the positive feedback circuit 63 as a charging circuit does not charge the conversion signal LVI with electricity. On the other hand, signals at Hi as the initialization signals INI1 and INI2 are supplied, the transistor 103 conducts, so that the positive feedback circuit 63 discharges the conversion signal LVI. In addition, since the transistor 101 is cut off, the positive feedback circuit 63 does not charge the conversion signal LVI through the transistor 102. As a result, the conversion signal LVI is discharged to the GND level, and the positive feedback circuit 63 outputs the output signal VCO at Hi by using the transistors 104 and 105 configuring the inverter, thereby initializing the comparison circuit 51.

After the initialization, each of the initialization signals INI1 and INI2 is set to Lo, thereby starting the sweeping of the reference signal REF.

For a period of time for which the reference signal REF is higher in voltage than the pixel signal SIG, the transistor 86 is turned OFF to be cut off, and since the output signal VCO becomes the signal at Hi, the transistor 102 is also turned OFF to be cut off. The transistor 103 is also cut off because the initialization signal INI1 is set at Lo. The conversion signal LVI holds the GND while a high impedance state is held, and thus, the output signal VCO at Hi is outputted.

When the reference signal REF becomes lower in voltage than the pixel signal SIG, the output current from the transistor 85 as the current source is not caused to flow through the transistor 81. As a result, each of the gate potentials of the transistors 83 and 84 rises, so that a channel resistance of the transistor 84 becomes high. Then, a current flowing to the transistor 84 through the transistor 82 causes the voltage drop to reduce the gate potential, so that the transistor 91 conducts. The output signal HVO outputted from the transistor 86 is converted into the conversion signal LVI by the transistor 91 of the voltage converting circuit 62 and is then supplied to the positive feedback circuit 63. The positive feedback circuit 63 as the charging circuit charges the conversion signal LVI with electricity to cause the potential to approach from the GND voltage to the second power source voltage VDDL.

Then, when the voltage of the conversion signal LVI exceeds a threshold voltage of the inverter configured by the transistors 104 and 105, the output signal VCO becomes Lo, and the transistor 102 conducts. The transistor 101 also conducts because the initialization signal INI2 at Lo is applied thereto, and the positive feedback circuit 63 rapidly charges the conversion signal LVI through the transistors 101 and 102 to increase the potential up to the second power source voltage VDDL at once.

Since the bias voltage VBIAS is applied to the gate of the transistor 91 of the voltage converting circuit 62, if the voltage of the conversion signal LVI reaches the voltage which is reduced from the bias voltage VBIAS by the transistor threshold value, then, the transistor 91 of the voltage converting circuit 62 is cut off. Even if the transistor 86 is held in a conduction state, the transistor 86 does not further charge the conversion signal LVI, and thus, the voltage converting circuit 62 functions as a voltage clamping circuit as well.

The charging of the conversion signal LVI resulting from the conduction of the transistor 102 is the positive feedback operation in which it is the beginning that the voltage of the conversion signal LVI has risen to the inverter threshold value in the first place, and the movement of interest is accelerated. Since the number of circuits which operate in parallel and simultaneously in the solid-state imaging apparatus 1 is enormous, in the transistor 85 as the current sources of the differential input circuit 61, the current per one circuit is set to a very small current. Moreover, since a voltage which is changed for unit time at which the time code is switched is an LSB step of the AD conversion, the reference signal REF is very slowly swept. Therefore, a change in gate potential of the transistor 86 is also slow, and a change of the output current of the transistor 86 driven by the gate potential of the transistor 86 is also slow. However, the positive feedback is applied from the subsequent stage to the conversion signal LVI charged by the output current of the transistor 86, so that the output signal VCO can transit sufficiently rapidly. Preferably, the transition time of the output signal VCO is a fraction of the unit time of the time code, and is equal to or smaller than 1 ns as a typical example. Only by setting a small current, for example, 0.1 uA to the transistor 85 of the current source, the comparison circuit 51 of the present disclosure can attain this output transition time.

<Example of Detailed Configuration of Pixel Circuit>

A description will be given with respect to a detailed configuration of the pixel circuit 41 with reference to FIG. 5.

Figure 5:
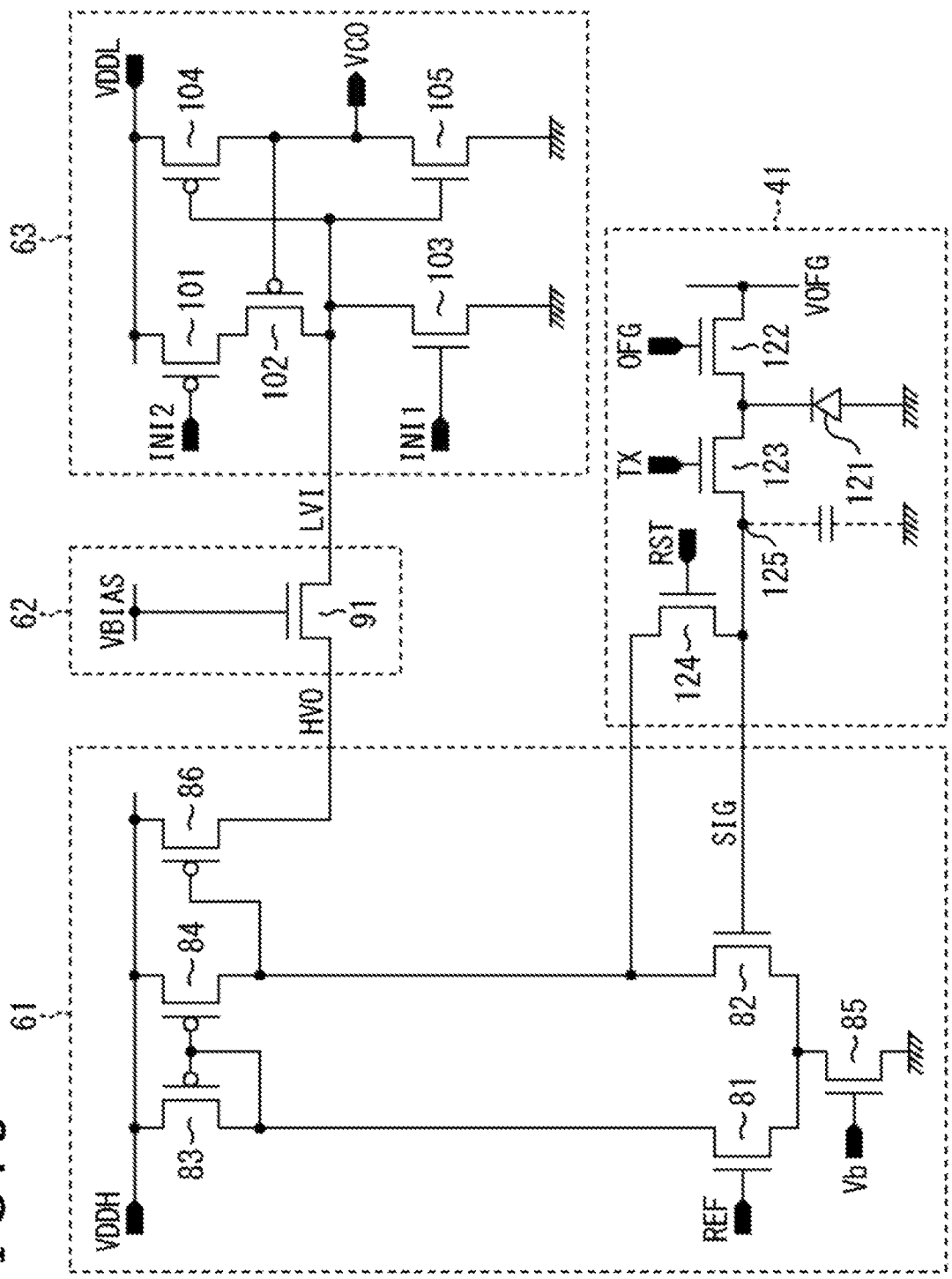
FIG. 5 is a circuit diagram explaining a detailed configuration of a pixel circuit.

FIG. 5 is a circuit diagram depicting a configuration in which details of the pixel circuit 41 are added to the comparison circuit 51 depicted in FIG. 3.

The pixel circuit 41 includes a photodiode (PD) 121 as a photoelectric conversion element, a discharge transistor 122, a transfer transistor 123, a reset transistor 124, and a floating diffusion layer (FD) 125.

The discharge transistor 122 is used to adjust a period of time for exposure. Specifically, if the discharge transistor 122 is turned ON when the period of time for the exposure is desired to start at an arbitrary timing, then, electric charges accumulated in the photodiode 121 until that time are discharged. Therefore, when the discharge transistor 122 is turned OFF, the period of time for the exposure is started.

The transfer transistor 123 transfers the electric charges produced in the photodiode 121 to the FD 125. The reset transistor 124 resets the electric charges held in the FD 125. The FD 125 is connected to the gate of the transistor 82 of the differential input circuit 61. As a result, the transistor 82 functions also as an amplifying transistor of the pixel circuit 41.

A source of the reset transistor 124 is connected to a gate of the transistor 82 of the differential input circuit 61, and the FD 125, and a drain of the reset transistor 124 is connected to a drain of the transistor 82. Therefore, there is no fixed reset voltage for resetting the electric charges in the FD 125. This is because, by controlling a circuit state of the differential input circuit 61, the reset voltage used to reset the FD 125 can be arbitrarily set by use of the reference signal REF.

<Timing Chart of Pixel Section>

A description will be given with respect to an operation of the pixel 21 depicted in FIG. 5 with reference to a timing chart of FIG. 6.

First, at time t1, the reference signal REF is set from a stand-by voltage $V_{stb}$ to a reset voltage $V_{rst}$ used to reset the electric charges in the FD 125 to turn ON the reset transistor 124, thereby resetting the electric charges in the FD 125.

Next, at time t2, the initialization signal INI2 which is supplied to the gate of the transistor 101 of the positive feedback circuit 63 is set at Hi, and just after this setting operation, the initialization signal INI1 which is supplied to the gate of the transistor 103 is set at Hi, and the positive feedback circuit 63 is set the initial state.

In addition, at the time t2, the reference signal REF is made to rise up to a predetermined voltage $V_u$, and the comparison between the reference signal REF and the pixel signal SIG (sweeping of the reference signal REF) is started. At this time point, since the reference signal REF is larger than the pixel signal SIG, the output signal VCO is at Hi.

At time t3 at which it is decided that the reference signal REF and the pixel signal SIG become identical in voltage to each other, the output signal VCO is inverted (makes the transition to Low). When the output signal VCO is inverted, as described above, the inversion of the output signal VCO is speeded up by the positive feedback circuit 63. In addition, in the data storing section 52, the time data (N-bits–DATA[1] to DATA[N]) at a time point at which the output signal VCO is inverted is latch-stored.

At time t4 at which a period of time for signal writing is ended and a period of time for signal reading is started, the voltage of the reference signal REF which is supplied to the gate of the transistor 81 of the comparison circuit 51 is reduced to a level (stand-by voltage $V_{stb}$) at which the transistor 81 is turned OFF. As a result, a consumed current of the comparison circuit 51 for the period of time for the signal reading is suppressed.

At time t5, a WORK signal used to control the reading timing becomes Hi, and the time data (N-bits–DATA[1] to DATA[N]) which has been latch-stored is outputted from the latch control circuit 71 of the data storing section 52. The time data acquired here becomes P-phase data at a reset level at which correlated double sampling (CD) processing is executed.

At time t6, the reference signal REF is made to rise up to the predetermined voltage $V_u$, and the initialization signal INI2 which is supplied to the gate of the transistor 101 is set at Hi. Just after this setting operation, the initialization signal INI1 which is supplied to the gate of the transistor 103 is also set at Hi and thus, the positive feedback circuit 63 is set to the initial state again.

At time t7, the transfer transistor 123 of the pixel circuit 41 is turned ON by a transfer signal TX at Hi, and the electric charges produced in the photodiode 121 are transferred to the FD 125.

Thereafter, after the initialization signal INI1 is returned back to Low so as to follow the transition of the initialization signal INI2 to Low, the comparison between the reference signal REF and the pixel signal SIG (sweeping of the reference signal REF) is started. At this time point, since the reference signal REF is larger than the pixel signal SIG, the output signal VCO is at Hi.

Then, at time t8 at which it is decided that the reference signal REF and the pixel signal SIG become identical in voltage to each other, the output signal VCO is inverted (makes the transition to Low). When the output signal VCO is inverted, the inversion of the output signal VCO is speeded up by the positive feedback circuit 63. In addition, in the data storing section 52, the time data (N-bits–DATA[1] to DATA[N]) at the time point at which the output signal VCO is inverted is latch-stored.

At time t9 at which the period of time for the signal writing is ended and the period of time for the signal reading is started, the voltage of the reference signal REF which is supplied to the gate of the transistor 81 of the comparison circuit 51 is reduced to a level (a stand-by voltage $V_{stb}$) at which the transistor 81 is turned OFF. As a result, the consumed current of the comparison circuit 51 for the period of time for the signal reading is suppressed.

At time t10, the WORD signal used to control the reading timing becomes Hi, and the time data (N-bits–DATA[1] to DATA[N]) which has been latch-stored is outputted from the latch control circuit 71 of the data storing section 52. The time data acquired here become D-phase data at a signal level at which CDS processing is executed. At time t11, the state is the same as that at the time t1 described above, and next 1-V driving (a period of time for 1 vertical scanning) is performed.

According to the drive for the pixel 21 described above, first, after the P-phase data at the reset level is acquired, the P-phase data at the reset level is read out to the output section 28. Next, the D-phase data at the signal level is acquired and is read out to the output section 28. The output section 28 holds the P-phase data in an internal frame memory thereof, and executes the CDS processing for the P-phase data in combination with the D-phase data which is supplied later. It should be noted that an arbitrary method can be selected as a method of executing the CDS processing. For example, the data storing section 52 may hold therein the P-phase data, and may output the P-phase data simultaneously with the D-phase data or alternately and thus, the output section 28 may execute the CDS processing.

By performing the operation described above, for the pixels 21 of the pixel array section 22 of the solid-state imaging apparatus 1, a global shutter operation for simultaneously resetting all the pixels, and simultaneously exposing all the pixels can be performed. Since all the pixels can be simultaneously exposed and read out, a holding section is unnecessary which is normally provided in the pixel and operates to hold the electric charges while the electric charges are read out. In addition, with the configuration of the pixel 21, the selection transistor or the like is also unnecessary which has been necessary for the column parallel reading type solid-state imaging apparatus and which selects the pixel outputting the pixel signal SIG.

With the drive for the pixel 21 described with reference to FIG. 6, the discharge transistor 122 is usually controlled so as to be turned OFF. However, as indicated by a broken line in FIG. 6, after the discharge signal OFG is set at Hi at the desired time to temporarily turn ON the discharge transistor 122, then, the discharge transistor 122 is turned OFF, so that an arbitrary period of time for the exposure can also be set.

<4. Second Configuration Example of Comparison Circuit>

Figure 7:
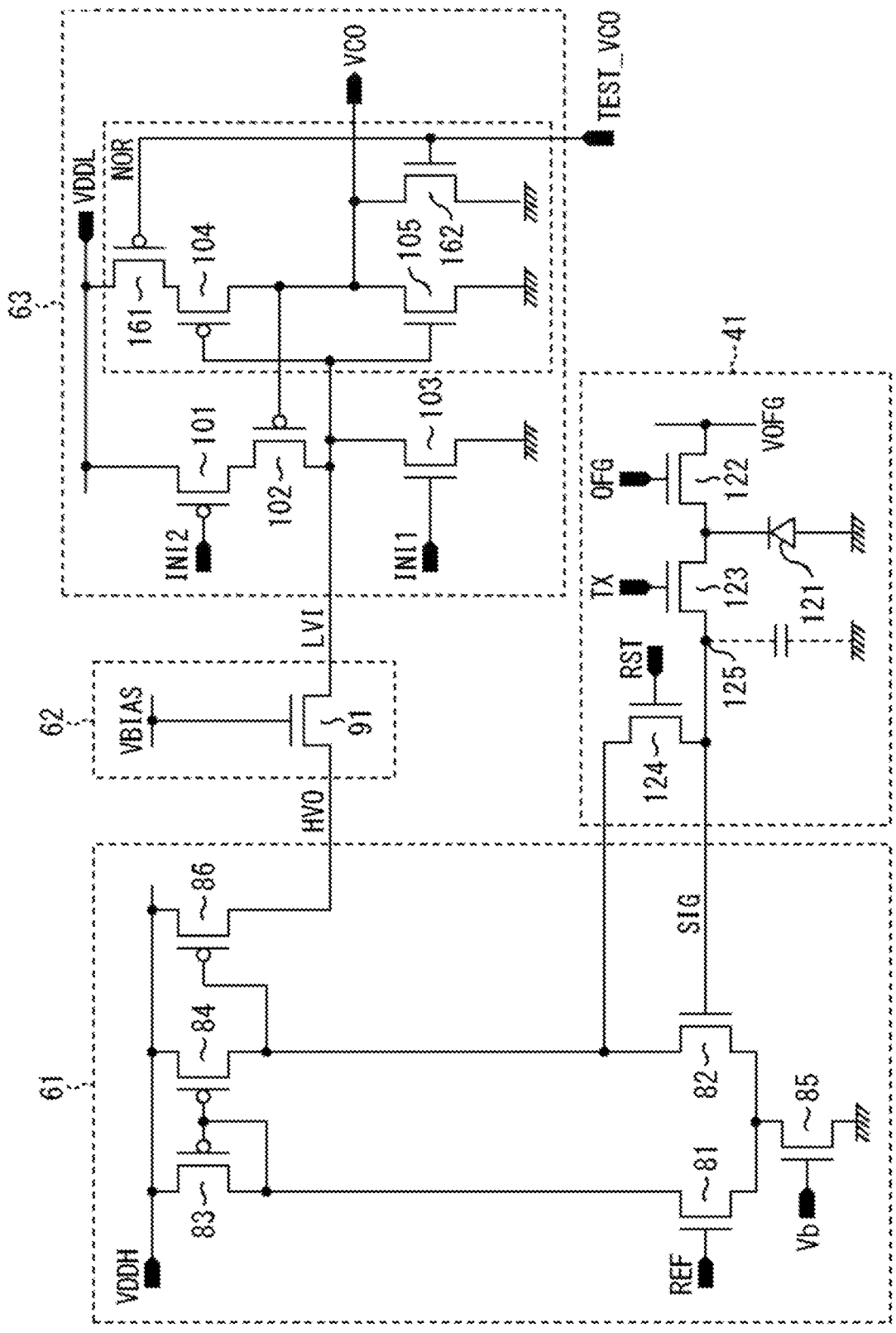
FIG. 7 is a circuit diagram depicting a second configuration of the comparison circuit.

FIG. 7 is a circuit diagram depicting a second configuration of the comparison circuit 51. Incidentally, FIG. 7 also depicts the detailed circuit of the pixel circuit 41 together with the second configuration of the comparison circuit 51. The same also applies to FIG. 8 to FIG. 11 which will be described later.

The second configuration of the comparison circuit 51 is similar to the first configuration depicted in FIG. 5 except that in the positive feedback circuit 63, two transistors 161 and 162 are added.

In the second configuration, the inverter circuit of the positive feedback circuit 63 in the first configuration is replaced with a 2-input NOR circuit control signal TEST_VCO as a second input which is not the conversion signal LVI as the first input is supplied to each of a gate of the transistor 161 including a PMOS transistor, and a gate of the transistor 162 including an NMOS transistor.

A source of the transistor 161 is connected to the second power source voltage VDDL, and a drain of the transistor 161 is connected to a source of the transistor 104. A drain of the transistor 162 is connected to an output terminal of the comparison circuit 51, and a source of the transistor 162 is connected to the GND.

In the comparison circuit 51 in the second configuration configured as described above, when the control signal TEST_VCO as the second input is set at Hi, the output signal VCO can be set at to irrespective of a state of a differential input circuit 61.

When a bias voltage VBIAS is controlled so as to be set at to level to cut off the transistor 91 and thus, each of the initialization signals INI1 and INI2 is set at Hi, the output signal VCO becomes Hi irrespective of the state of the differential input circuit 61. Therefore, the compulsive Hi output of the output signal VCO, and the compulsive to output by the control signal TEST_VCO described above are combined with each other, thereby enabling the output signal VCO to be set at an arbitrary value irrespective of the state of the differential input circuit 61, and the states of the pixel circuit 41 and the DAC 25 in the preceding stage of the differential input circuit 61. By using this function, for example, a circuit in the subsequent stage of the pixel 21 can be tested by only using the electric signal input without relying on an optical input to the solid-state imaging apparatus 1.

In addition, for example, when the voltage of the pixel signal SIG falls below a final voltage of the reference signal REF by the high luminance beyond expectations (for example, the sun image which is imaged within an angle of view of the solid-state imaging apparatus 1), the period of time for the comparison is ended while the output signal VCO of the comparison circuit 51 is held at Hi. As a result, it may be impossible for the data storing section 52 which is controlled by the output signal VCO to fix the value, and an AD conversion function is lost. For the purpose of preventing such a situation from being caused, the control signal TEST_VCO for the Hi pulse is inputted to the last of the sweeping of the reference signal REF, thereby enabling the output signal VCO which is not yet inverted to Lo to be forcibly inverted. Since the data storing section 52 latch-stores the time code ht before the compulsive inversion, in a case where the configuration of FIG. 7 is adopted, consequently, the ADC 42 functions as the AD converter which clamps an output value for the luminance input at a certain level or more.

<5. Third Configuration Example of Comparison Circuit>

Figure 8:
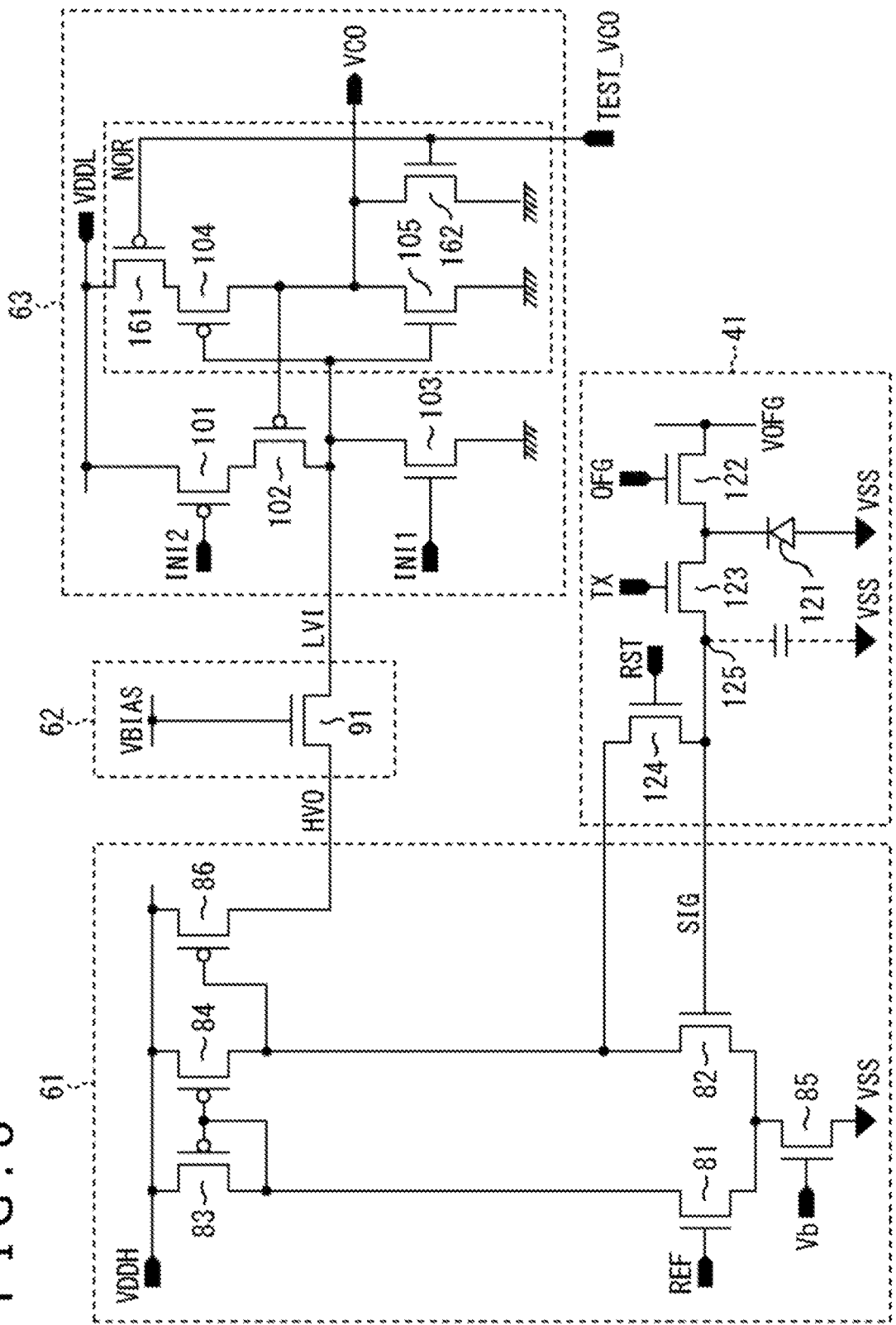
FIG. 8 is a circuit diagram depicting a third configuration of the comparison circuit.

FIG. 8 is a circuit diagram depicting a third configuration of the comparison circuit 51.

The third configuration of the comparison circuit 51 is different from the second configuration depicted in FIG. 7 in that, in the differential input circuit 61, the source of the transistor 85 as the constant current source is not connected to the GND, but is connected to a negative bias voltage VSS lower than 0 [V]. On the constituent elements are similar to those of the second configuration of FIG. 7. The negative bias voltage VSS, for example, is set to −1.8 [V].

In the third configuration of the comparison circuit 51, a source potential of the transistor 85 is set to a potential lower than 0 V, thereby expanding an operation range of the comparison circuit 51. In addition, the photodiode 121, and the substrate voltage side of the FD 125 within the pixel circuit 41 are each set to the negative bias voltage VSS so as to follow that the source potential of the transistor 85 is set negative. As a result, an amount of saturation electric charges of each of the pixels 21 (pixel circuit 41) can be increased.

<6. Fourth Configuration Example of Comparison Circuit>

Figure 9:
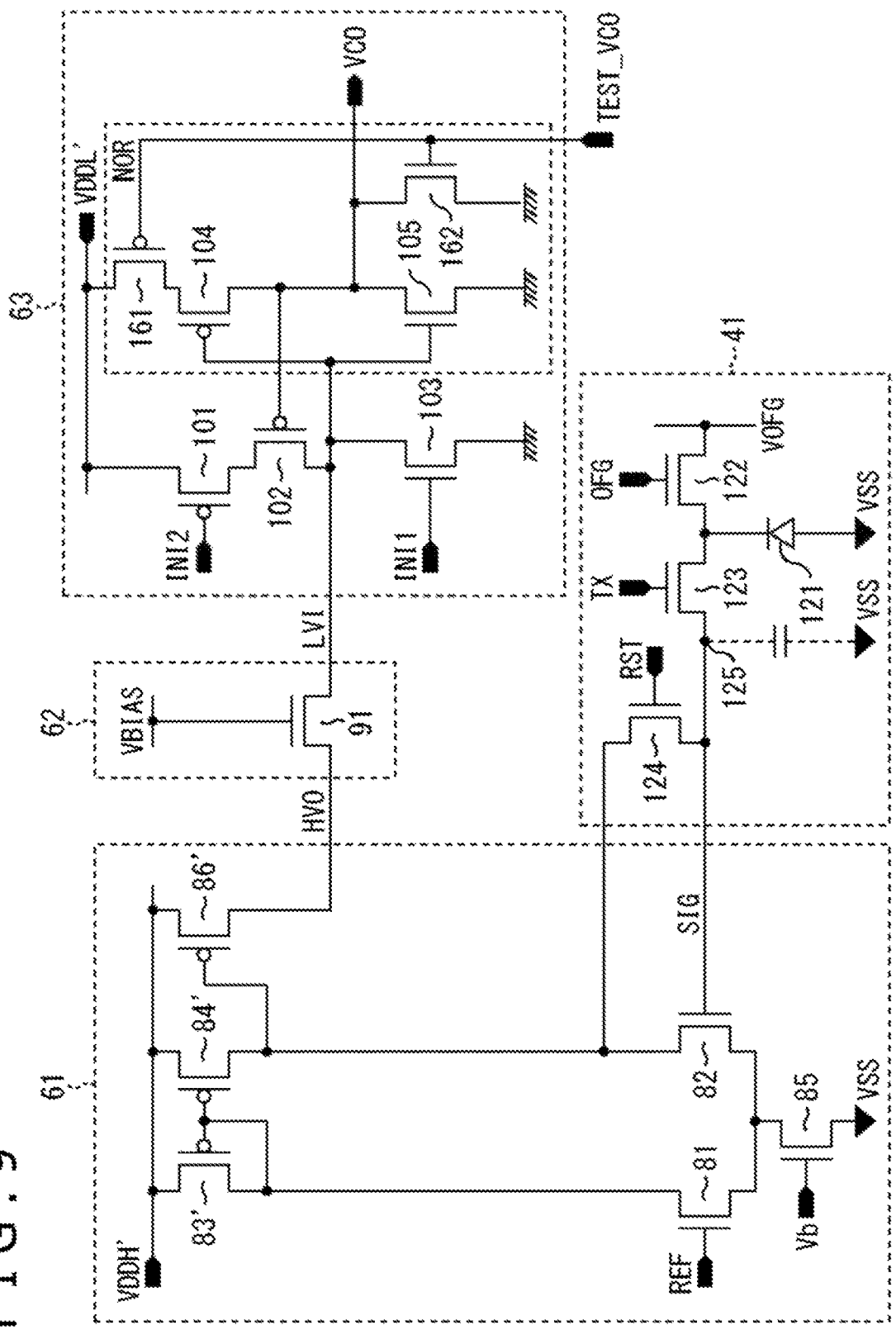
FIG. 9 is a circuit diagram depicting a fourth configuration of the comparison circuit.

FIG. 9 is a circuit diagram depicting a fourth configuration of the comparison circuit 51.

In the fourth configuration of the comparison circuit 51, the transistors 83, 84 and 86 of the differential input circuit 61 depicted in FIG. 8 are changed to transistors 83', 84' and 86'. Other constituent elements are similar to those of the second configuration of FIG. 7.

In the third configuration depicted in FIG. 8, the first power source voltage VDDH, for example, set to substantially 2.9 [V], and each of the transistors 83, 84 and 86 of the differential input circuit 61 includes a high-voltage system transistor having a large film thickness.

In contrast, in the fourth configuration of FIG. 9, each of the transistors 83', 84' and 86' includes a low-voltage system transistor, having a small film thickness, which is driven with a low voltage equal to or smaller than 2 V. More specifically, the first power source voltage VDDH of 2.9 [V] is reduced to a first power source voltage VDDH' of 1.1 [V] so as to follow that the source potential of the transistor 85 is reduced to the negative voltage VSS (−1.8 [V]), thereby enabling the transistors 83, 84 and 86 of the differential input circuit 61 to be changed to the low voltage system transistors 83', 84' and 86'. The entire potential difference of the comparison circuit 51 is in the range of 2.9 [V] from −1.8 [V] to 1.1 [V], and does not differ from each of the first and second configurations in each of which the entire potential difference of the comparison circuit 51 is in the range of 2.9 [V] from 0 [V] to 2.9 [V].

In the fourth configuration, high-voltage system transistors 83, 84 and 86 each having the large film thickness are changed to the low-voltage system transistors 83', 84' and 86' each having the small film thickness, thereby enabling a circuit area of the comparison circuit 51.

Although the second power source voltage VDDL may be held at 1.1 [V] which is identical to the case of each of the first to third configurations, the positive feedback circuit 63 can be operated with the voltage lower than the first power source voltage VDDH' of the differential input circuit 61. Therefore, the first power source voltage VDDL may be reduced to a voltage lower than the first power source voltage VDDH' so as to follow that the first power source voltage VDDH is reduced to the first power source voltage VDDH'. As a result, the power saving can be further promoted. The second power source voltage VDDL', for example, can be set at substantially 0.6 [V]. The bias voltage VBIAS is also reduced so as to follow the reduction of the second power source voltage VDDL'.

<7. Fifth Configuration Example of Comparison Circuit>

Figure 10:
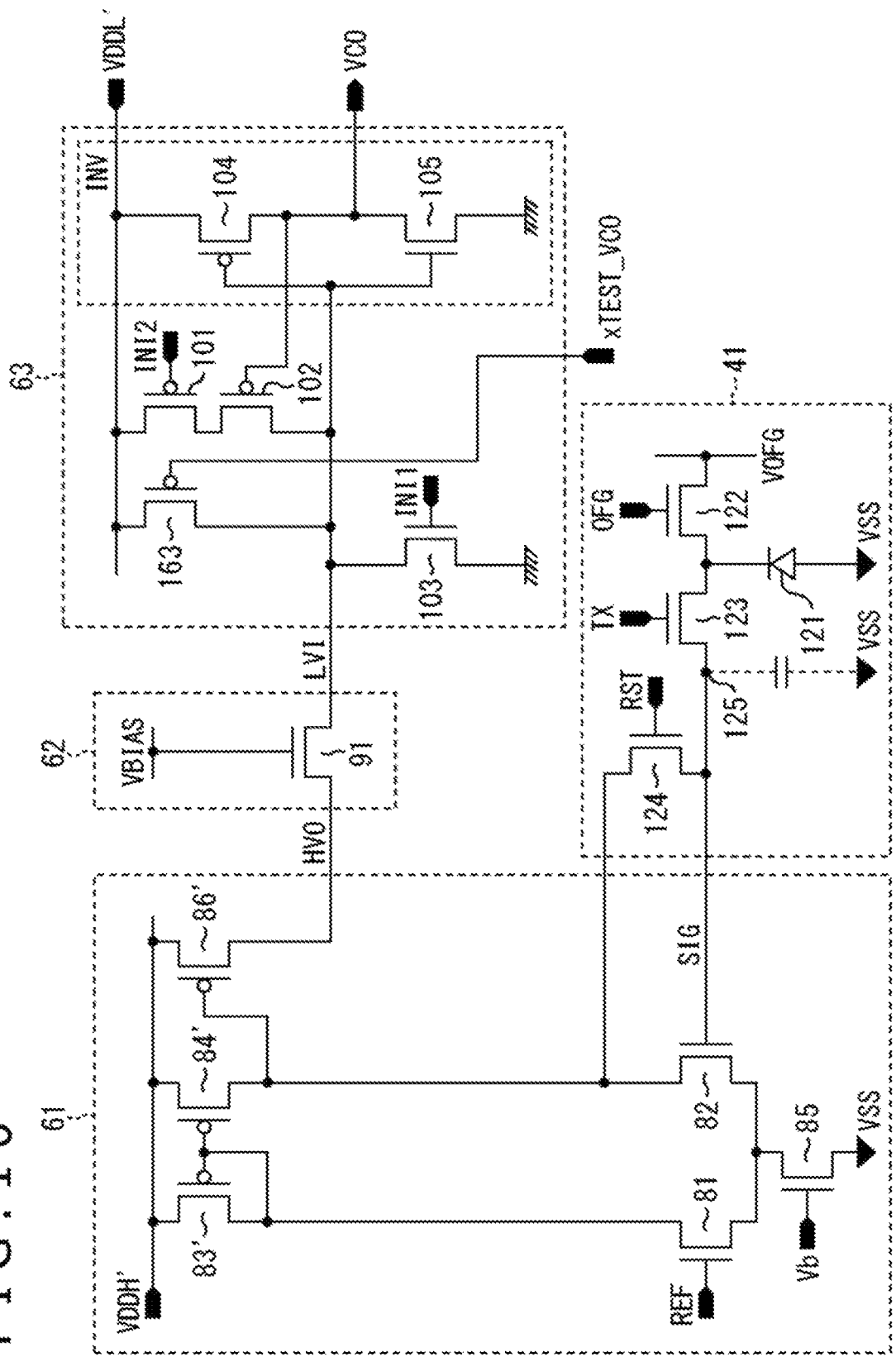
FIG. 10 is a circuit diagram depicting a fifth configuration of the comparison circuit.

FIG. 10 is a circuit diagram depicting a fifth configuration of the comparison circuit 51.

Comparing the fifth embodiment of the comparison circuit 51 with the fourth configuration of FIG. 9, the transistors 161 and 162 are omitted in the positive feedback circuit 63, and the 2-input NOR circuit is returned back to the inverter circuit. In addition, a transistor 163 as a PMOS transistor is newly added to the positive feedback circuit 63. A source of the transistor 163 is connected to the second power source voltage VDDL', and a drain thereof is connected to the source of the transistor 91 together with the drains of the transistors 102 and 103, and the gates of the transistors 104 and 105. A control signal xTEST_VCO as the inversed signal of the control signal TEST_VCO inputted to the NOR circuit is supplied to the gate of the transistor 163. Other constituent elements are similar to those in the fourth configuration of FIG. 9.

In the fifth configuration of the comparison circuit 51 of FIG. 10, a test function of enabling the output signal VCO of the comparison circuit 51 to be forcibly set at a to output irrespective of the state of the differential input circuit 61 is realized by supplying the control signal xTEST_VCO at Lo to the gate of the transistor 163.

In other words, in the fifth configuration of the comparison circuit 51 of FIG. 10, the test function is realized by using a method different from that in the fourth configuration depicted in FIG. 9. When the control signal xTEST_VCO at Lo is supplied to the gate of the transistor 163 with the initialization signal INI1 set at to, the comparison circuit 51 outputs the output signal VCO at Lo. Conversely, when the control signal xTEST_VCO at Hi is supplied to the gate of the transistor 163 with the initialization signal INI1 set at Hi, the comparison circuit 51 outputs the output signal VCO at Hi.

According to the fifth configuration of the comparison circuit 51 of FIG. 10, the test function can be realized in which the number of transistors is less than that in the fourth configuration depicted in FIG. 9 by one.

In addition, according to the fifth configuration of the comparison circuit 51 of FIG. 10, malfunction which may be caused by reducing the second power source voltage VDDL of the positive feedback circuit 63 to the second power source voltage VDDL' can be prevented from occurring.

<8. Sixth Configuration Example of Comparison Circuit>

Figure 11:
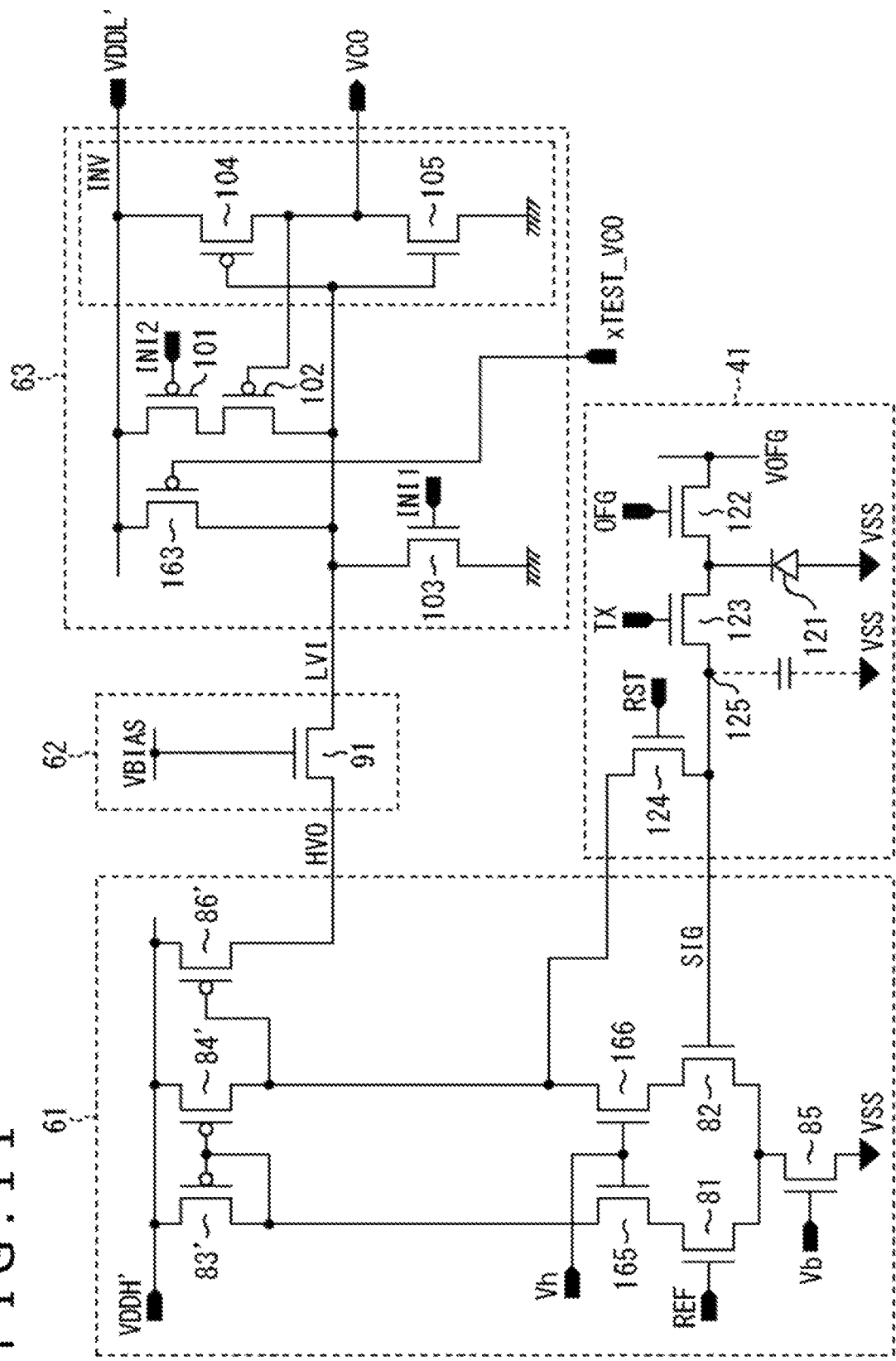
FIG. 11 is a circuit diagram depicting a sixth configuration of the comparison circuit.

FIG. 11 is a circuit diagram depicting a sixth configuration of the comparison circuit 51.

Comparing the sixth configuration of the comparison circuit 51 with the fifth configuration of FIG. 10, a configuration of the differential input circuit 61 is different from that in the fifth configuration. Specifically, a transistor 165 is added between the transistors 81 and 83', and a transistor 166 is added between the transistors 82 and 84'.

Each of the transistors 165 and 166 includes an NMOS transistor, and a control signal Vh is supplied to each of gates of the transistors 165 and 166. A source of the transistor 165 is connected to the drain of the transistor 81, and a drain of the transistor 165 is connected to a drain of the transistor 83'. A source of the transistor 166 is connected to a drain of the transistor 82, and a drain of the transistor 166 is connected to a drain of the transistor 84'.

Since each of the transistors 83', 84' and 86' is directly connected to either the transistor 81 or 82 in the fifth configuration depicted in FIG. 10, the negative bias voltage VSS can be reduced only to a voltage at which the low-voltage system transistors 83', 84' and 86' can withstand.

Then, the comparison circuit 51 of FIG. 11 is configured in such a way that the transistor 165 is inserted between the transistors 81 and 83', and the transistor 166 is inserted between the transistors 82 and 84', so that a portion between the transistors 81 and 83', and a portion between the transistors 82 and 84' can be separated from each other according to need. As a result, the negative bias voltage VSS, for example, can be reduced to a voltage at which the high-voltage system transistor can withstand.

According to the sixth configuration of the comparison circuit 51 of FIG. 11, the first power source voltage VDDH' can be reduced to 1.1 [V], and the negative bias voltage VSS can be reduced to the voltage at which the high-voltage system transistor can withstand. Therefore, the power consumption can be reduced while the amount of saturation electric charges of each of the pixels 21 (pixel circuit 41) is secured. In addition, since the low-voltage system transistors 83', 84' and 86' are used, the circuit area can be reduced, and the cost can be suppressed.

<Timing Chart>

Figure 12:
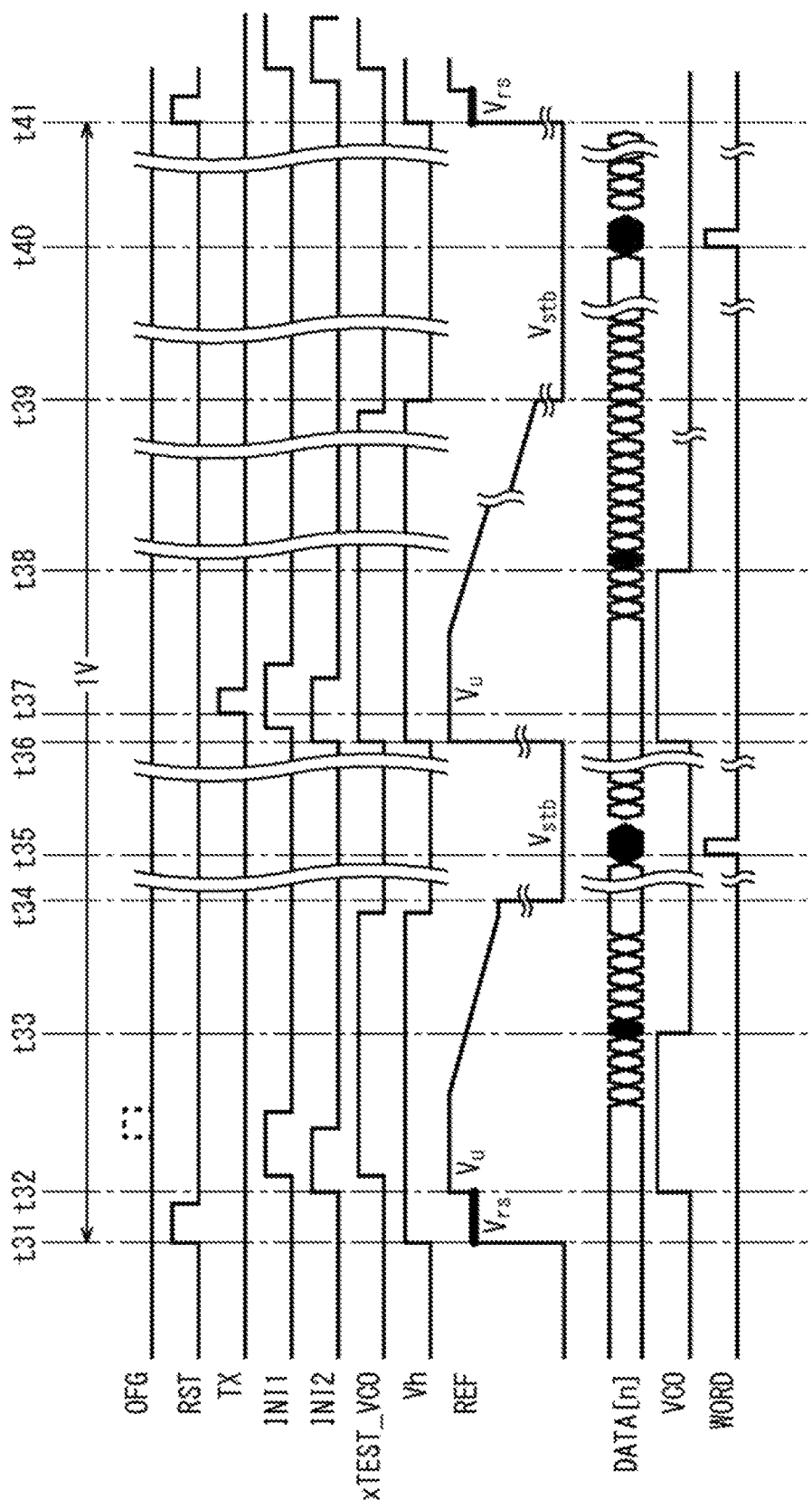
FIG. 12 is a timing chart explaining the sixth configuration of the comparison circuit and an operation of a pixel.

FIG. 12 is a timing chart explaining an operation of the pixel 21 (pixel circuit 41) in the sixth configuration of the comparison circuit 51 depicted in FIG. 11.

Figure 6:
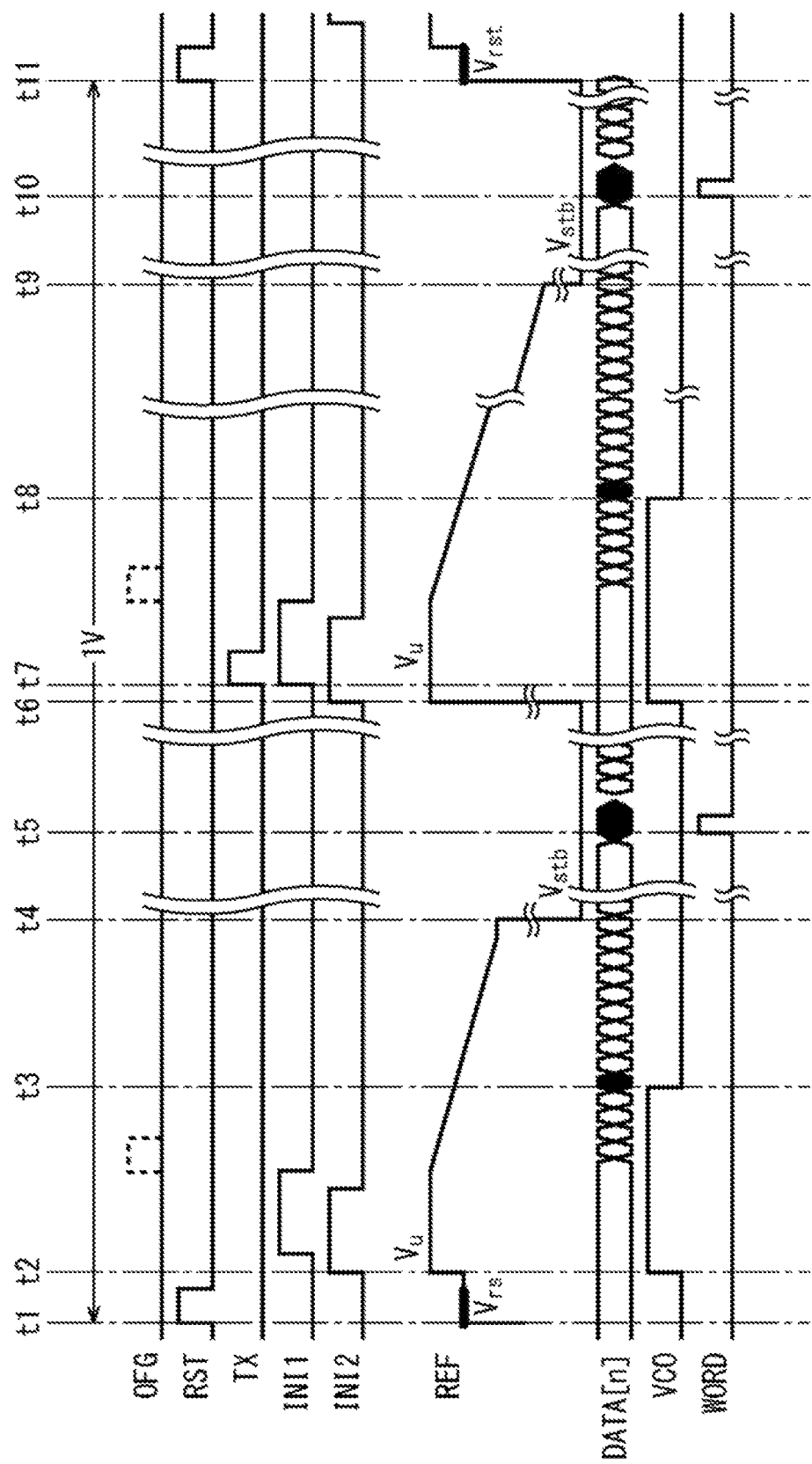
FIG. 6 is a timing chart explaining the first configuration of the comparison circuit and an operation of the pixel.

A period of time from t31 to t41 of the timing chart of FIG. 12 corresponds to the period of time from the t1 to the t11 of the timing chart of FIG. 6.

In the timing chart of FIG. 12, there are added the control signal xTEST_VCO for the test function and the control signal Vh supplied to each of the gates of the transistors 165 and 166 as breakdown-voltage relaxation transistors. Since operations other than those of the control signal xTEST_VCO and the control signal Vh are the same as those in the timing chart of FIG. 6, a description thereof is omitted here.

As depicted in FIG. 12, for a period of time for which the reference signal REF is reduced to the standby voltage $V_{std}$, the control signal Vh is set at Lo, and the comparison circuit 51 is controlled in such a way that high potential difference is prevented from being applied to the transistors 83', 84' and 86'. In contrast, for a period of time for which the reference signal REF is set to the reset voltage $V_{rst}$ or the voltage $V_u$, the control signal Vh is set at Hi Meanwhile, the voltage at Hi of the control signal Vh is determined by the first power source voltage VDDH' and the negative bias voltage VSS of the differential input circuit 61. For example, as depicted above, in a case where the first power source voltage VDDH' is set at 1.1 and the negative bias voltage VSS is set at −1.8 [V], the voltage of the control signal Vh at Hi can be set at 0 [V].

<9. Configuration Example of Pixel Sharing>

Although the comparison circuit 51 described so far adopts the configuration in which one ADC 42 is arranged within one pixel 21, a configuration can also be adopted in which a plurality of pixels 21 share one ADC 42 in common.

Figure 13:
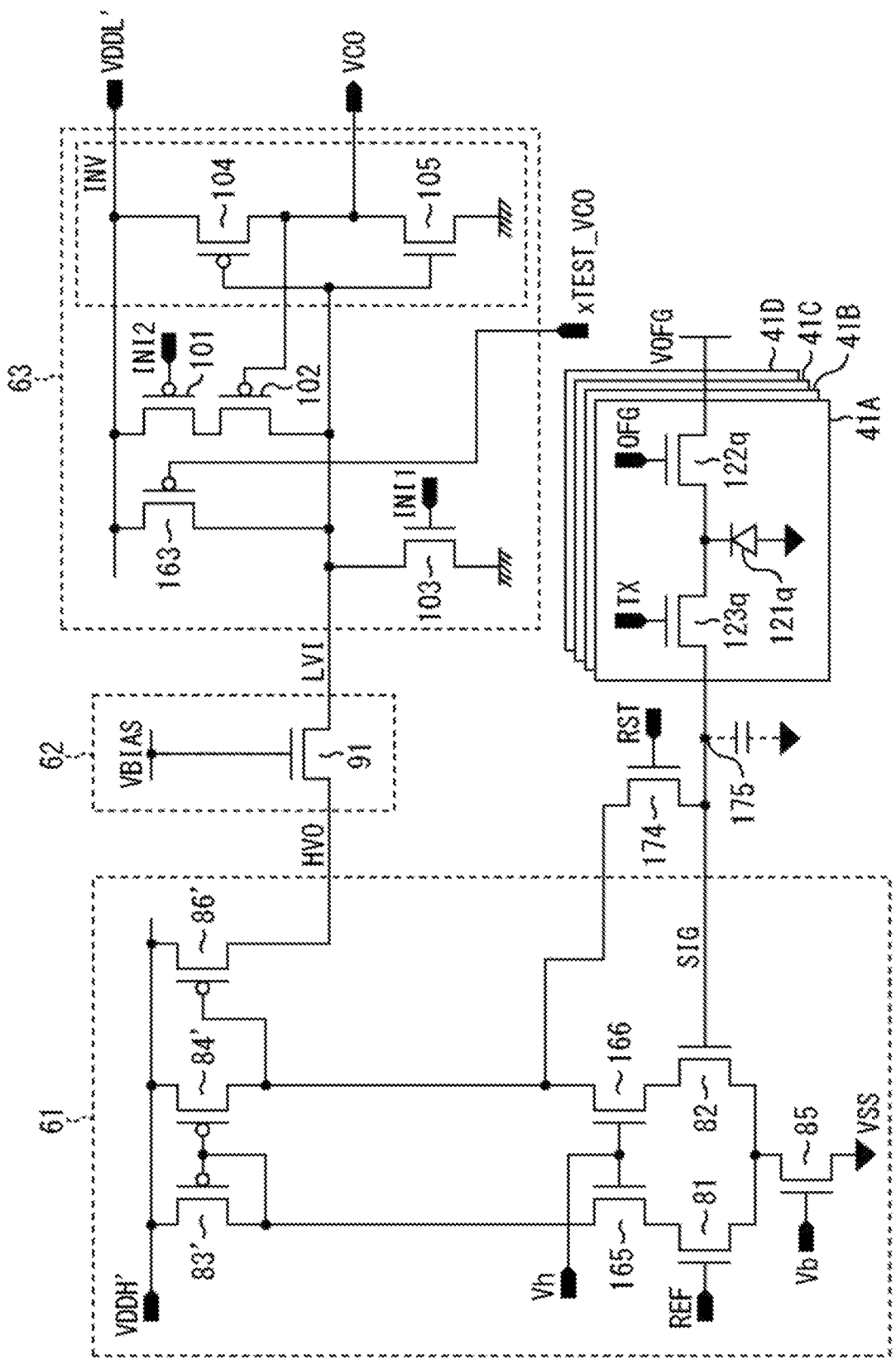
FIG. 13 is a circuit diagram depicting a configuration example of a comparison circuit in the case of pixel sharing.

FIG. 13 is a circuit diagram depicting a configuration example of the comparison circuit 51 in a case where the pixel sharing in which a plurality of pixels 21 share one ADC 42 in common is performed.

FIG. 13 depicts a configuration example of the comparison circuit 51 in a case where four pixels 21 such as a pixel 21A, a pixel 21B, a pixel 21C, and a pixel 21D share one ADC 42 in common.

In FIG. 13, each of the configurations of the differential input circuit 61, the voltage converting circuit 62, and the positive feedback circuit 63 configuring the comparison circuit 51 is similar to the sixth configuration depicted in FIG. 11.

In FIG. 13, the four pixels 21A to 21D include pixel circuits 41A to 41D, respectively. Each of the pixel circuits 41A to 41D includes a photodiode 121*q*, a discharge transistor 122*q*, and a transfer transistor 123*q*. On the other hand, a reset transistor 174 and the FD 175 are shared in common by the four pixels 21A to 21D.

It should be noted that, although the sixth configuration depicted in FIG. 11 is adopted as the circuit configuration of the comparison circuit 51 in FIG. 13, any of the first configuration to the fifth configuration can also be adopted.

<10. Plural Substrate Configuration 1>

Although the description so far has been given in such a way that the solid-state imaging apparatus 1 is formed on one sheet of semiconductor substrate 11, the circuits may be formed on a plurality of sheets of semiconductor substrates separately from one another, thereby configuring the solid-state imaging apparatus 1.

Figure 14:
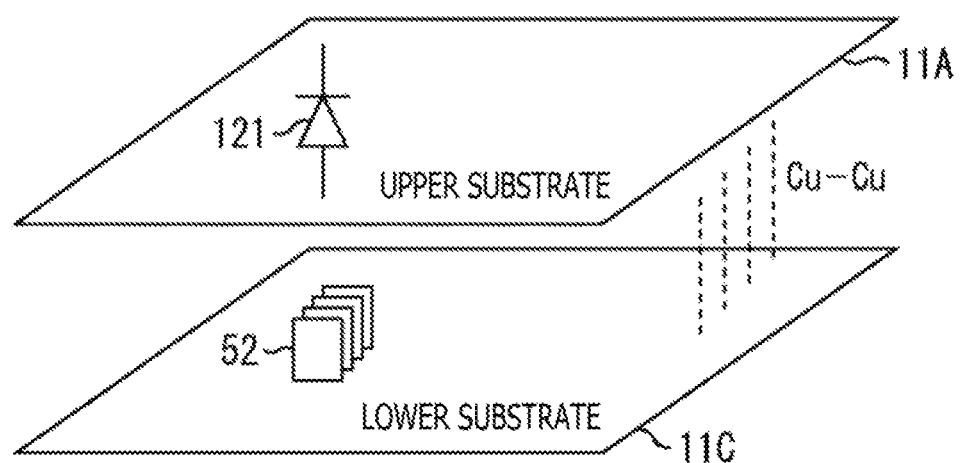
FIG. 14 is a conceptual view configuring a solid-state imaging apparatus by laminating two sheets of semiconductor substrates.

FIG. 14 depicts a conceptual view configuring the solid-state imaging apparatus 1 by laminating two sheets of semiconductor substrates 11 such as an upper substrate 11A and a lower substrate 11C.

The pixel circuit 41 including the photodiode 121 is at least formed on the upper substrate 11A. The data storing section 52 storing the time code, and the time code transferring section 23 are at least formed on the lower substrate 11C. The upper substrate 11A and the lower substrate 11C, for example, are joined to each other by metal binding such as Cu—Cu.

Figure 15:
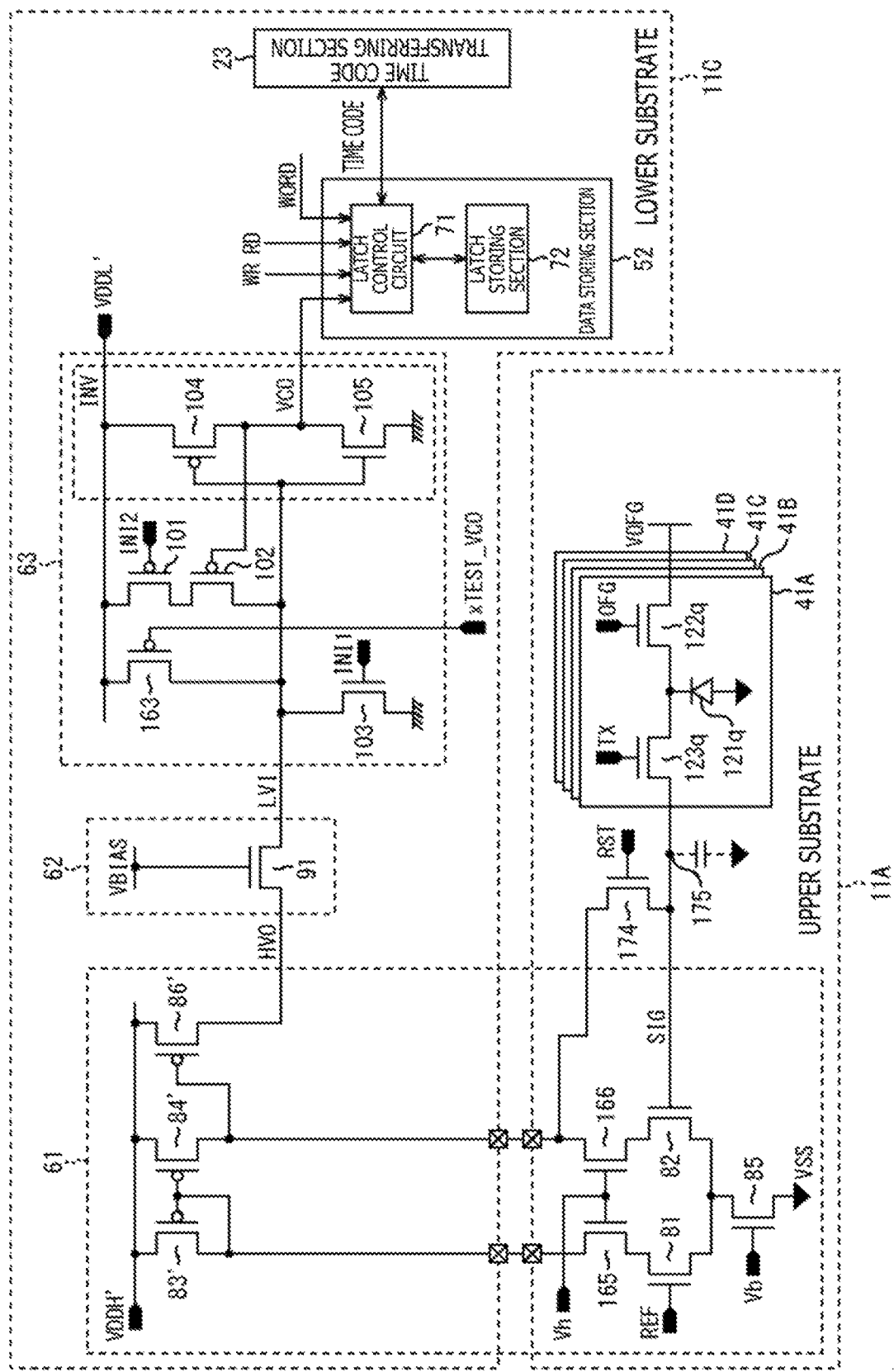
FIG. 15 is a circuit diagram depicting an example of a circuit configuration in a case where a solid-state imaging apparatus is configured by using two sheets of semiconductor substrates.

FIG. 15 depicts a configuration example of circuits which are individually formed on the upper substrate 11A and the lower substrate 11C.

The pixel circuit 41, and the transistors 81, 82, 85, 165, and 166 of the differential input circuit 61 of the ADC 42 are formed on the upper substrate 11A. The circuit of the ADC 42 except for the transistors 81, 82, 85, 165, and 166, and the time code transferring section 23 are formed on the lower substrate 11C.

<11. Plural Substrate Configuration 2>

Although, in FIG. 14 and FIG. 15, the description has been given with respect to the example in which the solid-state imaging apparatus 1 is configured by using the two sheets of semiconductor substrates 11, the solid-state imaging apparatus 1 can also be configured by using three sheets of semiconductor substrates 11.

Figure 16:
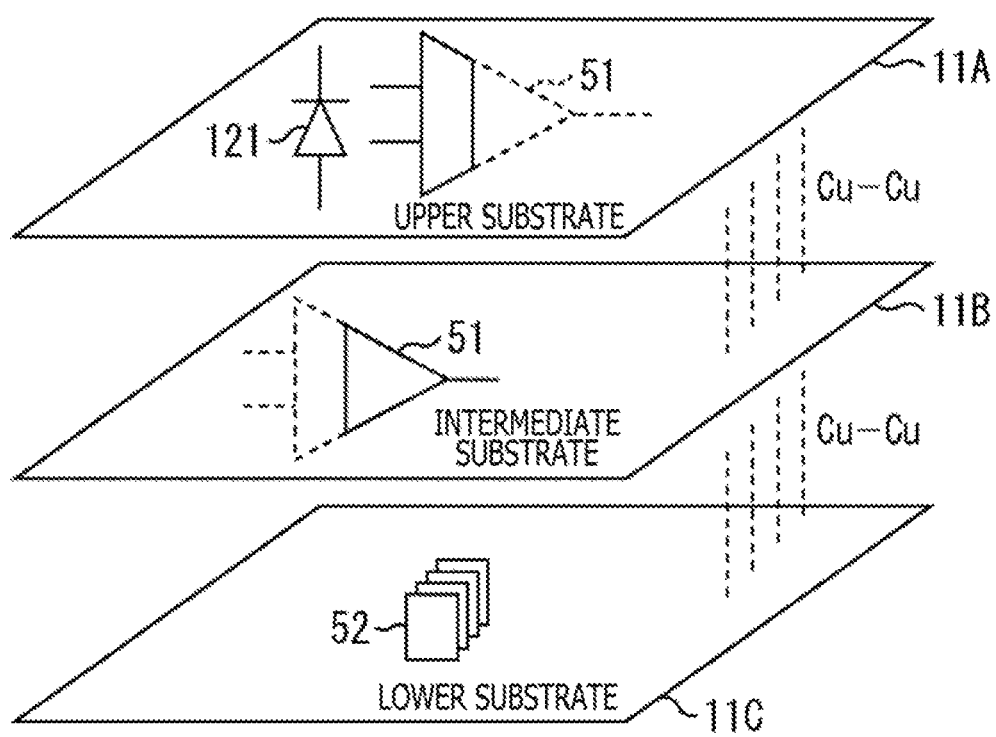
FIG. 16 is a circuit diagram depicting an example of a circuit configuration in a case where a solid-state imaging apparatus is configured by laminating three sheets of semiconductor substrates.

FIG. 16 depicts a conceptual view configuring the solid-state imaging apparatus 1 by laminating three sheets of semiconductor substrates 11 such as the upper substrate 11A, an intermediate substrate 11B, and the lower substrate 11C.

The pixel circuit 41 including the photodiode 121, and at least a part of a circuit of the comparison circuit 51 are formed on the upper substrate 11A. The data storing section 52 storing the time code, and the time code transferring section 23 are at least formed on the lower substrate 11C. A remaining circuit, of the comparison circuit 51, which is not arranged on the upper substrate 11A is formed on the intermediate substrate 11B. The upper substrate 11A and the intermediate substrate 11B, and the intermediate substrate 11B and the lower substrate 11C, for example, are joined to each other by metal binding such as Cu—Cu.

Figure 17:
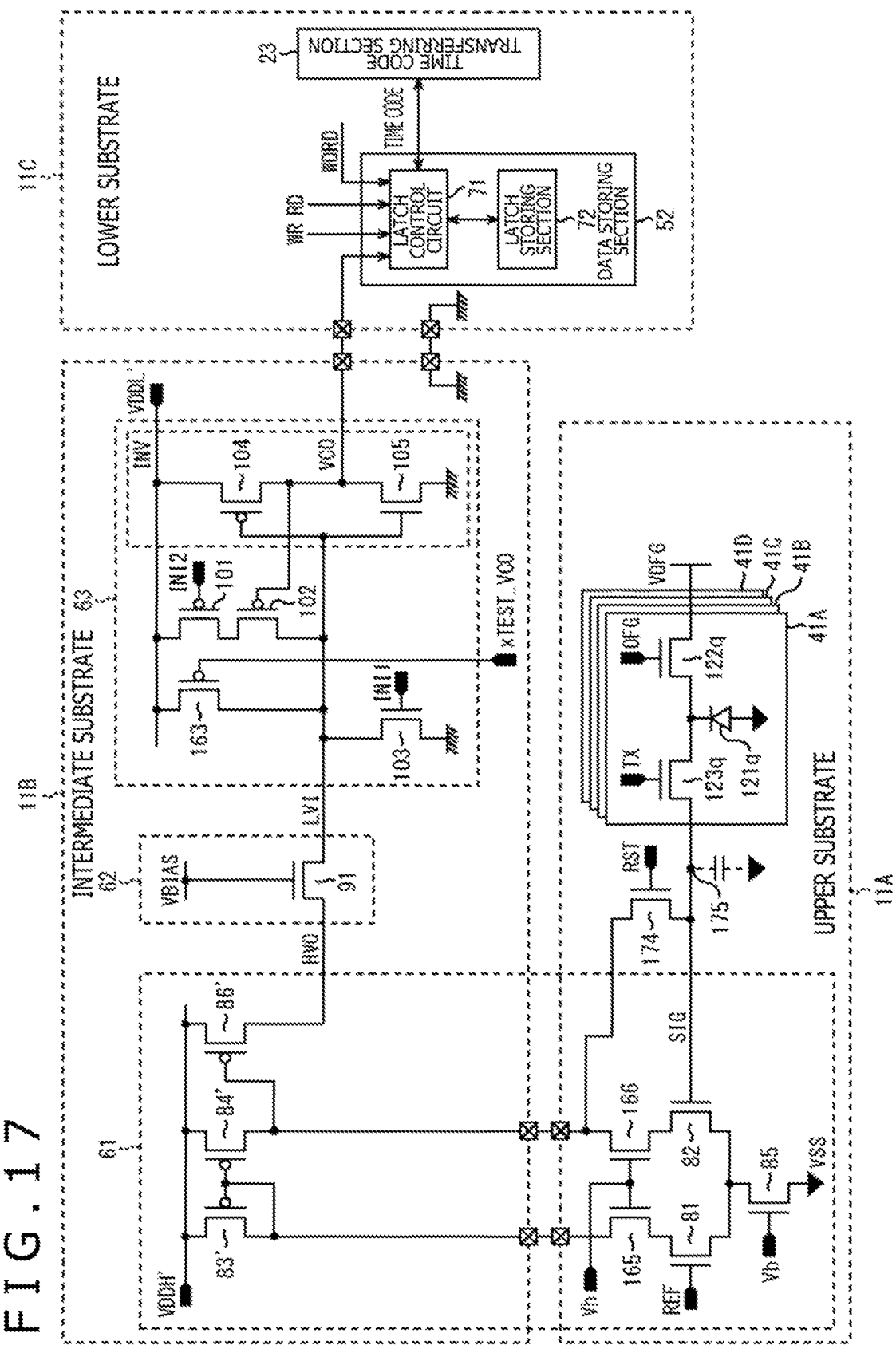
FIG. 17 is a circuit diagram depicting an example of a circuit configuration in a case where a solid-state imaging apparatus is configured by three sheets of semiconductor substrates.

FIG. 17 depicts an example of arrangement of the circuits of the semiconductor substrates 11 in a case where the solid-state imaging apparatus 1 is formed by using the three sheets of semiconductor substrates 11.

In the example of FIG. 17, the circuits arranged on the upper substrate 11A are the same as those of the upper substrate 11A depicted in FIG. 15, the remaining circuit of the comparison circuit 51 is arranged on the intermediate substrate 11B, and the data storing section 52 and the time code transferring section 23 are arranged on the lower substrate 11G.

<12. Application Example to Electronic Apparatus>

The present disclosure is by no means limited to the application to the solid-state imaging apparatus. More specifically, the present disclosure can also be applied to the whole of the electronic apparatuses, in each of which the solid-state imaging apparatus is used in an image capturing section (photoelectric conversion section), such as an imaging apparatus such as a digital still camera or a video camera, a mobile terminal device having an imaging function, or a copying machine using the solid-state imaging apparatus in an image reading section. The solid-state imaging apparatus may have a form in which it is formed as one chip, or may have a module-shaped form, having an imaging function, in which an imaging section, and a signal processing section or an optical system are collectively packaged.

FIG. 18 is a block diagram depicting a configuration example of an imaging apparatus as an electronic apparatus according to the present disclosure.

An imaging apparatus 800 of FIG. 18 includes an optical section 801 including a lens group and the like, a solid-state imaging apparatus (imaging device) 802 adopting the configuration of the solid-state imaging apparatus 1 of FIG. 1, and a digital signal processing (DSP) circuit 803 as a camera signal processing circuit. In addition, the imaging apparatus 800 also includes a frame memory 804, a display section 805, a recording section 806, a manipulation section 807, and a power source section 808. The DSP circuit 803, the frame memory 804, the display section 805, the recording section 806, the manipulation section 807, and the power source section 808 are connected to one another through a bus line 809.

The optical section 801 takes therein incident light (image light) from a subject to image the incident light on an imaging surface of the solid-state imaging apparatus 802. The solid-state imaging apparatus 802 converts a quantity of incident light imaged on the imaging surface by the optical section 801 into an electric signal in units of a pixel, and outputs the resulting electric signal as a pixel signal. The solid-state imaging apparatus 1 of FIG. 1, that is, the solid-state imaging apparatus having the comparison circuit 51 in which the power consumption is reduced while the decision speed when the pixel signal is subjected to the AD conversion is enhanced can be used as the solid-state imaging apparatus 802 of interest.

The display section 805, for example, includes a panel type display device such as a liquid crystal panel or an organic electro luminescence (EL) panel, and displays a moving image or a still image captured in the solid-state imaging apparatus 802. The recording section 806 records data associated with a moving image or a still image imaged in the solid-state imaging apparatus 802 in a recording medium such as a hard disc or a semiconductor memory.

The manipulation section 807 issues a manipulation instruction with respect to various functions which the imaging apparatus 800 has under the manipulation by a user. The power source section SOS suitably supplies various kinds of power sources serving as operation power sources of the DSP circuit 803, the frame memory 804, the display section 805, the recording section 806, and the manipulation section 807 to these objects to be supplied.

As described above, the solid-state imaging apparatus 1 adopting any of the first configuration to the sixth configuration of the comparison circuit 51 described above is used as the solid-state imaging apparatus 802, resulting in that the power consumption can be reduced while the decision speed for the AD conversion is speeded up. Therefore, even in the imaging apparatus 800 such as the camera module for the video camera, the digital still camera, the camera module for the mobile apparatus such as a portable telephone, the speed-up of the photographing, and the low power consumption can be realized.

Although, in the above description, the comparison circuit 51 and the ADC 42 have been described as the components incorporated in the solid-state imaging apparatus 1, products (comparator, AD converter) which are distributed independently of each other can also be used as the comparison circuit 51 and the ADC 42, respectively.

In addition, the present disclosure is by no means limited to the solid-state imaging apparatus, and can also be applied to the whole of the semiconductor apparatuses having other semiconductor integrated circuits.

The embodiments of the present disclosure are by no means limited to the embodiments described above, and various changes can be made without departing from the gist of the present disclosure.

For example, in each of the circuit configurations described above, even in the circuit configuration in which the polarities of the transistors (NMOS transistor and PMOS transistor) are replaced with each other, the solid-state imaging apparatus can also be realized. In this case, the control signals which are inputted to the transistor, becomes signals in which the levels (Hi and to) are inverted.

Although, in each of the embodiments described above, the reference signal REF is the slope signal the level (voltage) of which is monotonically decreased with a lapse of time, the reference signal REF can also be made a slope signal a level (voltage) of which is monotonically increased with a lapse of time.

In each of the embodiments described above, in a case where the ADC 42 is shared, the example has been described in which the four pixels 21 share the ADC 42 in common. However, the number of pixels 21 performing the sharing is not limited to four, and the other number of pixels 21 (for example, eight) can be adopted.

In addition thereto, an embodiment which is obtained by combining all of or part of a plurality of the embodiments described above can be adopted. An embodiment obtained by suitably combining other embodiments which are not described in the embodiments described above can also be adopted.

It should be noted that the effect described in the present specification is an example only and is not limited, and effects other than the effect described in the present specification may also be offered.

It should be noted that the present disclosure can also adopt the following constitutions.

(1)

A comparator, including:

a differential input circuit operating at a first power source voltage, and outputting a signal when a voltage of an input signal is higher than a voltage of a reference signal;

a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit; and a voltage converting circuit converting the output signal from the differential input circuit into a signal corresponding to the second power source voltage, in which a source voltage of the differential input circuit is a voltage lower than 0 V.

(2)

The comparator according to (1) described above, in which the differential input circuit includes a first transistor and a second transistor configuring a current mirror, and the first transistor and the second transistor each include a low-voltage system transistor.

(3)

The comparator according to (2) described above, in which the low-voltage system transistor is driven by the first power source voltage equal to or lower than 2 V.

(4)

The comparator according to (2) or (3) described above, in which the differential input circuit further includes:

a third transistor to which the reference signal is inputted;

a fourth transistor to which the input signal is inputted; and a fifth transistor and a sixth transistor turning ON or OFF a connection between the first transistor and the second transistor, and a connection between the third transistor and the fourth transistor.

(5)

The comparator according to any of (1) to (4) described above, in which the positive feedback circuit receives input of a control signal different from the output signal from the differential input circuit, and inverses the comparison result signal on the basis of the control signal irrespective of the output signal from the differential input circuit.

(6)

The comparator according to (5) described above, in which the positive feedback circuit has:

an inverter circuit inverting the output signal from the differential input circuit to produce the comparison result signal; and a transistor supplying the second power source voltage to the inverter circuit on the basis of the control signal.

(7)

The comparator according to (5) described above, in which the positive feedback circuit has a NOR circuit which receives as inputs thereof the output signal from the differential input circuit, and the control signal.

(8)

An AD converter, including:
a comparator including
a differential input circuit operating at a first power source voltage, and outputting a signal when a voltage of an input signal is higher than a voltage of a reference signal,
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and
a voltage converting circuit converting the output signal from the differential input circuit into a signal corresponding to the second power source voltage,
in which a source voltage of the differential input circuit is a voltage lower than 0 V; and
a data storing section storing a time code when comparison result signal is inversed.

(9)

A solid-state imaging apparatus, including:
an AD converter including
a comparator including
a differential input circuit operating at a first power source voltage, and outputting a signal when a voltage of an input signal is higher than a voltage of a reference signal,
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and
a voltage converting circuit converting the output signal from the differential input circuit into a signal corresponding to the second power source voltage,
in which a source voltage of the differential input circuit is a voltage lower than 0 V, and
a data storing section storing a time code when the comparison result signal is inversed; and
a pixel circuit outputting an electric charge signal produced by receiving light incident to a pixel and then subjecting the light to photoelectric conversion as the input signal to the differential input circuit.

(10)

The solid-state imaging apparatus according to (9) described above, in which the AD converter is arranged for each pixel.

(11)

The solid-state imaging apparatus according to (9) described above, in which the AD converter is shared among a plurality of the pixels.

(12)

The solid-state imaging apparatus according to (9) or (10) described above, in which the solid-state imaging apparatus includes a plurality of semiconductor substrates.

(13)

An electronic apparatus, including:
a solid-state imaging apparatus including
an AD converter including
a comparator including
a differential input circuit operating at a first power source voltage, and outputting a signal when a voltage of an input signal is higher than a voltage of a reference signal,
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and
a voltage converting circuit converting the output signal from the differential input circuit into a signal corresponding to the second power source voltage,
in which a source voltage of the differential input circuit is a voltage lower than 0 V, and
a data storing section storing a time code when the comparison result signal is inversed; and
a pixel circuit outputting an electric charge signal produced by receiving light incident to a pixel and then subjecting the light to photoelectric conversion as the input signal to the differential input circuit.

(14)

A method of controlling a comparator, the comparator including a differential input circuit operating at a first power source voltage, a positive feedback circuit operating at a second power source voltage lower than the first power source voltage, and a voltage converting circuit, a source voltage of the differential input circuit being lower than 0 V, the method including:
the differential input circuit outputting a signal when a voltage of an input signal is higher than a voltage of a reference signal;
the voltage converting circuit converting an output signal from the differential input circuit into a signal corresponding to the second power source voltage; and
the positive feedback circuit speeding up a transition speed when a comparison result signal representing a result of comparison in voltage between the input signal and the reference signal is inverted on the basis of the output signal from the differential input signal obtained by conversion in the voltage converting circuit.

REFERENCE SIGNS LIST

1 ... Solid-state imaging apparatus, 11 ... Semiconductor substrate, 21 ... Pixel, 22 ... Pixel array section, 23 ... Time code transferring section, 26 ... Time code generating section, 28 ... Output section, 41 ... Pixel circuit, 42 ... ADC, 51 ... Comparison circuit, 52 ... Data storing section, 61 ... Differential input circuit, 62 ... Voltage converting circuit, 63 ... Positive feedback circuit, 71 ... Latch control circuit, 72 ... Latch storing section, 81 to 86, 91 ... Transistor, 101 to 105, 161 to 163, 165, 166 ... Transistor, 800 Imaging apparatus, 802 ... Solid-state imaging apparatus

What is claimed is:

1. A comparator, comprising:
a differential input circuit operating at a first power source voltage, and outputting a signal when a voltage of an input signal is higher than a voltage of a reference signal;
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit; and
a voltage converting circuit converting the output signal from the differential input circuit into a signal corresponding to the second power source voltage,
wherein a source voltage of the differential input circuit is a voltage lower than 0 V.

2. The comparator according to claim 1,
wherein the differential input circuit includes a first transistor and a second transistor configuring a current mirror, and the first transistor and the second transistor each include a low-voltage system transistor.

3. The comparator according to claim 2,
wherein the low-voltage system transistor is driven by the first power source voltage equal to or lower than 2 V.

4. The comparator according to claim 2,
wherein the differential input circuit further includes:
a third transistor to which the reference signal is inputted;
a fourth transistor to which the input signal is inputted; and
a fifth transistor and a sixth transistor turning ON or OFF a connection between the first transistor and the second transistor, and a connection between the third transistor and the fourth transistor.

5. The comparator according to claim 1,
wherein the positive feedback circuit receives input of a control signal different from the output signal from the differential input circuit, and inverses the comparison result signal on the basis of the control signal irrespective of the output signal from the differential input circuit.

6. The comparator according to claim 5,
wherein the positive feedback circuit has:
an inverter circuit inverting the output signal from the differential input circuit to produce the comparison result signal; and
a transistor supplying the second power source voltage to the inverter circuit on the basis of the control signal.

7. The comparator according to claim 5,
wherein the positive feedback circuit has a NOR circuit which receives as inputs thereof the output signal from the differential input circuit, and the control signal.

8. An AD converter, comprising:
a comparator including
a differential input circuit operating at a first power source voltage, and outputting a signal when a voltage of an input signal is higher than a voltage of a reference signal,
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and
a voltage converting circuit converting the output signal from the differential input circuit into a signal corresponding to the second power source voltage,
in which a source voltage of the differential input circuit is a voltage lower than 0 V; and
a data storing section storing a time code when the comparison result signal is inversed.

9. A solid-state imaging apparatus, comprising:
an AD converter including
a comparator including
a differential input circuit operating at a first power source voltage, and outputting a signal when a voltage of an input signal is higher than a voltage of a reference signal,
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and
a voltage converting circuit converting the output signal from the differential input circuit into a signal corresponding to the second power source voltage,
in which a source voltage of the differential input circuit is a voltage lower than 0 V, and
a data storing section storing a time code when the comparison result signal is inversed; and
a pixel circuit outputting an electric charge signal produced by receiving light incident to a pixel and then subjecting the light to photoelectric conversion as the input signal to the differential input circuit.

10. The solid-state imaging apparatus according to claim 9,
wherein the AD converter is arranged for each pixel.

11. The solid-state imaging apparatus according to claim 9,
wherein the AD converter is shared among a plurality of the pixels.

12. The solid-state imaging apparatus according to claim 9,
wherein the solid-state imaging apparatus comprises a plurality of semiconductor substrates.

13. An electronic apparatus, comprising:
a solid-state imaging apparatus including
an AD converter including
a comparator including
a differential input circuit operating at a first power source voltage, and outputting a signal when a voltage of an input signal is higher than a voltage of a reference signal,
a positive feedback circuit operating at a second power source voltage lower than the first power source voltage, and speeding up a transition speed when a comparison result signal representing a result of comparison in voltage between the input signal and the reference signal is inverted on the basis of an output signal from the differential input circuit, and
a voltage converting circuit converting the output signal from the differential input circuit into a signal corresponding to the second power source voltage,
in which a source voltage of the differential input circuit is a voltage lower than 0 V, and
a data storing section storing a time code when the comparison result signal is inversed; and
a pixel circuit outputting an electric charge signal produced by receiving light incident to a pixel and then subjecting the light to photoelectric conversion as the input signal to the differential input circuit.

14. A method of controlling a comparator, the comparator including a differential input circuit operating at a first power source voltage, a positive feedback circuit operating at a second power source voltage lower than the first power source voltage, and a voltage converting circuit, a source voltage of the differential input circuit being lower than 0 V, the method comprising:

the differential input circuit outputting a signal when a voltage of an input signal is higher than a voltage of a reference signal;

the voltage converting circuit converting an output signal from the differential input circuit into a signal corresponding to the second power source voltage; and the positive feedback circuit speeding up a transition speed when a comparison result signal representing a result of comparison in voltage between the input signal and the reference signal is inverted on the basis of the output signal from the differential input signal obtained by conversion in the voltage converting circuit.

\* \* \* \* \*